US010662315B2

(12) United States Patent
Hamada et al.

(10) Patent No.: US 10,662,315 B2
(45) Date of Patent: May 26, 2020

(54) EPOXY RESIN MOLDING MATERIAL FOR SEALING AND ELECTRONIC COMPONENT DEVICE

(71) Applicant: HITACHI CHEMICAL COMPANY, LTD., Tokyo (JP)

(72) Inventors: Mitsuyoshi Hamada, Tsukuba (JP); Fumio Furusawa, Tsukuba (JP); Ryoichi Ikezawa, Tsukuba (JP); Keizo Takemiya, Yuki (JP); Toru Baba, Yuki (JP)

(73) Assignee: HITACHI CHEMICAL COMPANY, LTD., Tokyo (JP)

(*) Notice: Subject to any disclaimer, the term of this patent is extended or adjusted under 35 U.S.C. 154(b) by 0 days.

(21) Appl. No.: 15/404,224

(22) Filed: Jan. 12, 2017

(65) Prior Publication Data

US 2017/0121505 A1    May 4, 2017

Related U.S. Application Data

(63) Continuation of application No. 14/116,979, filed as application No. PCT/JP2012/062063 on May 10, 2012.

(30) Foreign Application Priority Data

May 13, 2011 (JP) ................................. 2011-108227
Nov. 24, 2011 (JP) ................................. 2011-256806

(51) Int. Cl.
| | |
|---|---|
| *C08K 7/18* | (2006.01) |
| *H01L 23/29* | (2006.01) |
| *C08G 59/06* | (2006.01) |
| *C08G 59/68* | (2006.01) |
| *C08L 63/00* | (2006.01) |
| *C08G 59/62* | (2006.01) |
| *C08G 59/08* | (2006.01) |
| *C09K 3/10* | (2006.01) |
| *C08K 3/36* | (2006.01) |

(52) U.S. Cl.
CPC .............. *C08K 7/18* (2013.01); *C08G 59/063* (2013.01); *C08G 59/08* (2013.01); *C08G 59/621* (2013.01); *C08G 59/688* (2013.01); *C08L 63/00* (2013.01); *C09K 3/1006* (2013.01); *H01L 23/296* (2013.01); *C08K 3/36* (2013.01); *C08K 2201/005* (2013.01); *C08K 2201/006* (2013.01); *C09K 2003/1078* (2013.01); *H01L 2924/0002* (2013.01)

(58) Field of Classification Search
CPC ........ C08L 63/00–10; C09D 163/00–10; C09J 163/00–10; H01L 23/293–296; C08G 59/00–72
See application file for complete search history.

(56) References Cited

U.S. PATENT DOCUMENTS

| | | | | |
|---|---|---|---|---|
| 2006/0189721 A1* | 8/2006 | Akiyama | ............. | C08G 59/621 523/400 |
| 2009/0247670 A1* | 10/2009 | Hamada | ............... | C08G 59/621 523/450 |
| 2012/0001350 A1* | 1/2012 | Wada | ................... | C08G 59/621 257/793 |

FOREIGN PATENT DOCUMENTS

| | | | |
|---|---|---|---|
| JP | 11-147939 A | | 6/1999 |
| JP | 2000-103940 A | | 4/2000 |
| JP | 2002-284964 A | | 10/2002 |
| JP | 2003-073483 A | | 3/2003 |
| JP | 2003-261646 A | | 9/2003 |
| JP | 2003268206 A | * | 9/2003 |
| JP | 2004-002619 A | | 1/2004 |
| JP | 2004-292514 A | | 10/2004 |
| JP | 2006-052267 A | | 2/2006 |
| JP | 2008-115364 A | | 5/2008 |
| JP | 2010-031119 A | | 2/2010 |
| JP | 2011-001519 A | | 1/2011 |
| JP | 2011-084719 A | | 4/2011 |
| JP | 2011-094105 A | | 5/2011 |
| JP | 2011-094106 A | | 5/2011 |
| JP | 2017-175952 A | | 10/2017 |
| WO | WO-2010103745 A1 | * | 9/2010 ........... C08G 59/621 |

OTHER PUBLICATIONS

Machine translation of JP 2003268206 A.*
Mitsubishi Chemical, jER Epoxy Resins Catalogue (2016).*
Partial machine translation of JP 2003-073483 A with Office translation of Table 1 (2019).*
Partial machine translation of JP 2004-292514 A (2019).*
International Search of JP Appln. No. PCT/JP2012/062063 dated Jul. 31, 2012 in English.
English translation of JP 2006-052267 A.
Machine Translation of JP 2010-031119 A.
Machine Translation of JP 2003-261646.
Office Action of Japanese Appln. 2016-019261 dated Nov. 21, 2017 with English translation.

* cited by examiner

*Primary Examiner* — Kregg T Brooks

(74) *Attorney, Agent, or Firm* — Fitch, Even, Tabin & Flannery, LLP

(57) ABSTRACT

An epoxy resin molding material for sealing includes (A) an epoxy resin, (B) a curing agent, (C) a curing accelerator, (D) an inorganic filler, (E1) an arylamino group-containing alkoxysilane compound, and (E2) an epoxy group-containing alkoxy silane compound.

4 Claims, No Drawings

EPOXY RESIN MOLDING MATERIAL FOR SEALING AND ELECTRONIC COMPONENT DEVICE

CROSS-REFERENCE TO RELATED APPLICATIONS

This application is a continuation of application Ser. No. 14/116,979, filed Dec. 18, 2013, which is a 371 national stage entry of PCT/JP2012/062063, filed May 10, 2012, the content of each of which is incorporated herein in its entirety.

TECHNICAL FIELD

The present invention relates to an epoxy resin molding material for sealing and an electronic component device including an element sealed with the molding material.

BACKGROUND ART

Advancement in high-density mounting technologies has been accompanied by the miniaturization, weight reduction, and increasingly high performance of electronic apparatuses in recent years, whereby packaging of electronic component devices has been changed from conventional pin insertion to surface mounting. In order to increase mounting density and reduce mounting height, surface-mounted ICs, LSIs, and the like are enclosed in thin and small packages. The area of elements occupied in packages has increased, whereas the thickness of the packages has become extremely thinner. Additionally, those packaging use a mounting method different from that in conventional pin insertion packaging. Specifically, when mounting an electronic component device on a wiring board, conventional pin insertion packaging has performed soldering from a back side of the wiring board after inserting pins in the wiring board so that the package is not directly exposed to high temperature. However, in surface-mounting packaging, the entire electronic component device is treated in a solder bath, a reflow apparatus and the like, and thus the package is directly exposed to a soldering temperature (reflow temperature). As a result, when the package has absorbed moisture, the absorbed moisture rapidly swells during soldering and then a generated vapor pressure acts as peeling-off stress, causing peeling off between an insert such as a lead frame and a sealing material. This will lead to the occurrence of package cracks and the deterioration of electric characteristics. Accordingly, development of a sealing material excellent in solder heat resistance (reflow resistance) has been desired.

In order to meet the requirements, various investigations have been made thus far on epoxy resin as a main material. However, mere improvement in epoxy resin has caused reduction of heat resistance due to reduced hygroscopicity, curability reduction due to improved adhesiveness, and the like, so that it has been difficult to achieve balance between physical properties. Thus, under the above circumstances, various epoxy resin modifiers are under investigation. As one example among them, silane coupling agents have been examined by focusing on improvement in adhesiveness with an insert such as an element lead frame. Specifically, there are an epoxy group-containing silane coupling agent or an amino group-containing silane coupling agent (for example, see Japanese Patent Application Laid-Open (JP-A) No. H11-147939) and a sulfur atom-containing silane coupling agent for further adhesiveness improvement (for example, see JP-A No. 2000-103940).

SUMMARY OF INVENTION

However, some cases showed that the use of an epoxy group-containing silane coupling agent or an amino group-containing silane coupling agent does not have a sufficient adhesiveness improvement effect. Particularly, the amino group-containing silane coupling agent described in Patent Literature 1 above is highly responsive and when used in an epoxy resin molding material for sealing, fluidity reduction occurs, as well as there is a problem with handleability, such as gelation of the silane coupling agent itself. In addition, when the sulfur atom-containing silane coupling agent is used, an effect of improving adhesiveness with noble metals such as Ag and Au is insufficient and an effect of improving reflow resistance is also insufficient.

As described above, there has been hitherto no epoxy resin molding material for sealing sufficiently satisfying reflow resistance and moldability. The present invention has been accomplished under the circumstance in view. It is an object of the present invention to provide an epoxy resin molding material for sealing excellent in reflow resistance and moldability without reducing flame retardancy and an electronic component device including an element sealed with the material.

The present invention relates to an epoxy resin molding material for sealing including both a specific amino group-containing silane compound and a specific epoxy group-containing silane compound, and an electronic component device including an element sealed with the epoxy resin molding material for sealing. More specifically, the present invention is as follows:

The present invention relates to (1) an epoxy resin molding material for sealing including (A) an epoxy resin, (B) a curing agent, (C) a curing accelerator, (D) an inorganic filler, (E1) an acylamino group-containing alkoxysilane compound, and (E2) an epoxy group-containing alkoxysilane compound.

In addition, the present invention relates to (2) the epoxy resin molding material for sealing according to the (1), in which (E1) the arylamino group-containing alkoxysilane compound is a compound represented by the following general formula (I).

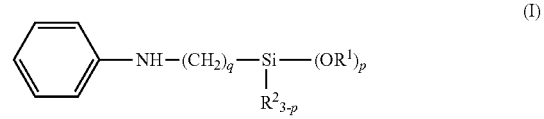

In the general formula (I), $R^1$ and $R^2$ each independently represent a hydrocarbon group having 1 to 6 carbon atoms, which may have a substituent; p represents an integer from 1 to 3; and q represents 2 or 3.

In addition, the present invention relates to (3) the epoxy resin molding material for sealing according to the (1) or the (2), in which (E2) the epoxy group-containing alkoxysilane compound is at least one compounds represented by the following general formulas (II) or (III).

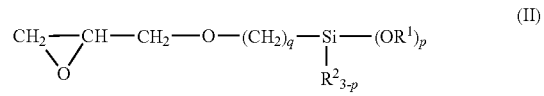

In the general formula (II), $R^1$ and $R^2$ each independently represent a hydrocarbon group having 1 to 6 carbon atoms, which may have a substituent; p represents an integer from 1 to 3; and q represents 2 or 3; and

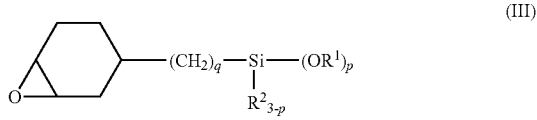
(III)

In the general formula (III), $R^1$ and $R^2$ each independently represent a hydrocarbon group having 1 to 6 carbon atoms, which may have a substituent; p represents an integer from 1 to 3; and q represents 2 or 3.

In addition, the present invention relates to (4) the epoxy resin molding material for sealing according to any one of the (1) to the (3), in which a total amount of (E1) the arylamino group-containing alkoxysilane compound in the epoxy resin molding material for sealing is from 10% by mass to 80% by mass with respect to a total amount of (E1) the arylamino group-containing alkoxysilane compound and (E2) the epoxy group-containing alkoxy silane compound in the epoxy resin molding material for sealing.

In addition, the present invention relates to (5) the epoxy resin molding material for sealing according to any one of the (1) to the (4), in which (E1) the total amount of the arylamino group-containing alkoxysilane compound and (E2) the epoxy group-containing alkoxy silane compound in the epoxy resin molding material for sealing is from 2% by mass to 15% by mass with respect to a total amount of (A) the epoxy resin in the epoxy resin molding material for sealing.

In addition, the present invention relates to (6) an electronic component device including an element sealed with the epoxy resin molding material for sealing according to any one of the (1) to the (5).

Advantageous Effects of the Invention

The present invention can provide an epoxy resin molding material for sealing having excellent reflow resistance and moldability without reducing flame retardancy, and an electronic component device including an element sealed with the material. Therefore, the present invention has great industrial value.

DESCRIPTION OF EMBODIMENTS

In the present specification, a numerical range represented by "to" indicates a range including numerical values before and after "to" as the minimum value and the maximum value, respectively. In addition, in the present specification, when there are plural substances corresponding to each ingredient in a composition, the amount of the each ingredient in the composition means a total amount of the plural substances present in the composition, unless otherwise specified.

An epoxy resin molding material for sealing of the present invention includes (A) an epoxy resin, (B) a curing agent, (C) a curing accelerator, (D) an inorganic filler, (E1) an arylamino group-containing alkoxysilane compound, and (E2) an epoxy group-containing alkoxy silane compound, and, as needed, is formed by including other ingredients.

By including an amino group-containing silane compound having a specific structure and an epoxy group-containing silane compound, the material for sealing is excellent in reflow resistance and moldability.

Additionally, the epoxy resin molding material for sealing is preferably a solid epoxy resin composition that is a solid at room temperature (25° C.), whereby the material for sealing is excellent in preservation stability. Additionally, the shape of the solid is not particularly limited and the solid can be of any shape, such as powder, granules, or tablets.

(E1) Arylamino Group-Containing Alkoxysilane Compound

The epoxy resin molding material for sealing of the present invention includes (E1) an arylamino group-containing alkoxysilane compound.

In general, (E2) an epoxy group-containing alkoxysilane compound reacts with an amino group, it is thus difficult to assume that an epoxy group-containing alkoxysilane compound is used together with an amino group-containing compound. However, in the present invention, by using (E1) the arylamino group-containing alkoxysilane compound, even when mixed with (E2) the epoxy group-containing alkoxysilane compound, the reduction of preservation stability of the mixture is suppressed, thereby suppressing viscosity increase and gelation of the mixture. Then, each of (E1) the arylamino group-containing alkoxysilane compound and (E2) the epoxy group-containing alkoxysilane compound exhibits function thereof, obtaining an epoxy resin molding material for sealing excellent in reflow resistance and moldability.

Although the reason for that is not known, it can be thought that the presence of an aryl group adjacent to the amino group inhibits the reactivity of a hydrogen atom of the amino group, thereby suppressing reaction with the epoxy group.

Accordingly, the structure of (E1) the arylamino group-containing alkoxysilane compound in the present invention is not particularly limited as long as the compound is an alkoxysilane compound having an aryl group adjacent to an amino group. Examples of (E1) the arylamino group in the arylamino group-containing alkoxysilane compound include phenylamino groups and naphthylamino groups. In addition, hydrogen atoms of phenylamino groups and naphthylamino groups each independently may be substituted with a hydrocarbon group having 1 to 9 carbon atoms, an amino group, an aminophenyl group, or an aminonaphtyl group. Examples of the hydrocarbon group having 1 to 9 carbon atoms include a methyl group, an ethyl group, a propyl group, an isopropyl group, a butyl group, an isobutyl group, a tert-butyl group, a pentyl group, a hexyl group, a cyclohexyl group, a vinyl group, a phenyl group, a methylphenyl group, an ethylphenyl group, a benzyl group, a methylbenzyl group, an ethylbenzyl group and a vinylbenzyl group.

Among them, it is preferable that (E1) the arylamino group-containing alkoxysilane compound in the present invention has a structure represented by the following general formula (I).

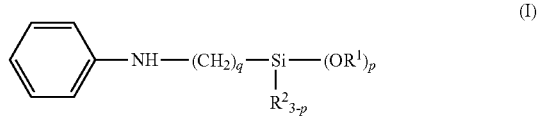
(I)

In the general formula (I), $R^1$ and $R^2$ each independently represent a hydrocarbon group having 1 to 6 carbon atoms, which may have a substituent; p represents an integer from 1 to 3; and q represents 2 or 3.

Examples of the hydrocarbon group having 1 to 6 carbon atoms represented by $R^1$ and $R^2$ in the general formula (I) include linear, branched, and cyclic alkyl groups such as a methyl group, an ethyl group, a propyl group, a butyl group, an isopropyl group, an isobutyl group, a t-butyl group, a pentyl group and a hexyl group, alkenyl groups such as a vinyl group, an allyl group, a butenyl group, a pentenyl group and a hexenyl group, and a phenyl group. Hydrogen atoms of these hydrocarbon groups may be substituted.

The hydrocarbon group may have a substituent. Examples of the substituent in the hydrocarbon groups include a hydroxy group, alkoxy groups having 1 to 6 carbon atoms, and an acetoxy group.

The hydrocarbon group having 1 to 6 carbon atoms represented by $R^1$ and $R^2$ is, from the viewpoint of fluidity and adhesiveness, preferably an alkyl group having 1 to 4 carbon atoms, more preferably a methyl group or an ethyl group, and from the viewpoint of easy availability, still more preferably a methyl group.

p in the general formula (I) represents, from the viewpoint of fluidity and adhesiveness, preferably 2 or 3, and from the viewpoint of easy availability, more preferably 3. q in the general formula (I) represents preferably 3, from the viewpoint of preservation stability and easy availability of the silane compound.

As such (E1) an arylamino group-containing alkoxysilane compound, Z-6883 manufactured by Toray DowCorning Co., Ltd., is available as a commercialized product.

Any one of these (E1) arylamino group-containing alkoxysilane compounds may be used alone or two or more thereof may be used in combination.

In the present invention, when using an amino group-containing alkoxysilane compound different from (E1) the arylamino group-containing alkoxysilane compound, such as γ-aminopropyltriethoxysilane, fluidity and reflow resistance are deteriorated, and also when mixed with (E2) the epoxy group-containing alkoxy silane compound, the preservation stability of the mixture is significantly deteriorated, thereby easily causing viscosity increase and gelation of the mixture.

(E2) Epoxy Group-Containing Alkoxy Silane Compound

The epoxy resin molding material for sealing of (E2) the present invention includes an epoxy group-containing alkoxy silane compound.

In the present invention, the structure of the epoxy group-containing alkoxy silane compound is not particularly limited as long as the compound is an alkoxysilane silane compound having an epoxy group. For example, (E2) the epoxy group-containing alkoxy silane compound used in the present invention is preferably at least one compounds represented by the following general formulas (II) or (III):

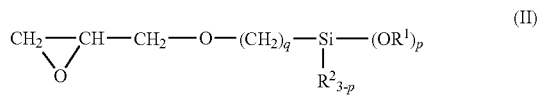

In the general formula (II), $R^1$ and $R^2$ each independently represent a hydrocarbon group having 1 to 6 carbon atoms, which may have a substituent; p represents an integer from 1 to 3; and q represents 2 or 3.

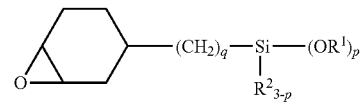

In the general formula (III), $R^1$ and $R^2$ each independently represent a hydrocarbon group having 1 to 6 carbon atoms, which may have a substituent; p represents an integer from 1 to 3; and q represents 2 or 3.

Examples of the hydrocarbon group having 1 to 6 carbon atoms represented by $R^1$ and $R^2$ in the general formulas (II) and (III) include linear, branched or cyclic alkyl groups such as a methyl group, an ethyl group, a propyl group, a butyl group, an isopropyl group, an isobutyl group, a t-butyl group, a pentyl group and a hexyl group, alkenyl groups such as a vinyl group, an allyl group, a butenyl group, a pentenyl group and a hexenyl group, and a phenyl group.

The hydrocarbon group may have a substituent. Examples of the substituent in the hydrocarbon group include a hydroxy group, alkoxy groups having 1 to 6 carbon atoms and an acetoxy group.

The hydrocarbon group having 1 to 6 carbon atoms represented by $R^1$ and $R^2$ is, particularly from the viewpoint of fluidity and adhesiveness, preferably an alkyl group having 1 to 4 carbon atoms, more preferably a methyl group or an ethyl group, and from the viewpoint of easy availability, still more preferably a methyl group.

p in the general formulas (II) and (III) represents, from the viewpoint of fluidity and adhesiveness, preferably 2 or 3, and from the viewpoint of easy availability, represents more preferably 3. Additionally, q in the general formula (II) represents, from the viewpoint of preservation stability and easy availability of the silane compound, preferably 3. q in the general formula (III) represents, from the viewpoint of preservation stability and easy availability of the silane compound, preferably 2.

Examples of such (E2) an epoxy group-containing alkoxysilane compound available as a commercialized product include Z-6040 (3-glycidoxypropyl trimethoxysilane), Z-6041 (3-glycidoxypropyl triethoxysilane), Z-6042 (3-glycidoxypropylmethyl diethoxysilane), Z-6043 (2-(3,4-epoxycyclohexyl)ethyl trimethoxysilane), and Z-6044 (3-glycidoxypropylmethyl dimethoxysilane) manufactured by Toray DowCorning Co., Ltd.

Any one of these (E2) epoxy group-containing alkoxysilane compounds may be used alone or two or more thereof may be used in combination. When using two or more (E2) epoxy group-containing alkoxysilane compounds, only the compound represented by the general formula (II) may be used, only the compound represented by the general formula (III) may be used, or the compound represented by the general formula (II) and the compound represented by the general formula (III) may be used in combination.

when a total amount of (E1) the arylamino group-containing alkoxysilane compound in the epoxy resin molding material for sealing with respect to a total amount of (E1) the arylamino group-containing alkoxysilane compound and (E2) the epoxy group-containing alkoxysilane compound in the epoxy resin molding material for sealing is regarded as "E1 content percentage", the E1 content percentage is not particularly limited as long as the advantageous effects of the present invention are not impaired. Above all, from the viewpoint of a balance between reflow resistance and respective characteristics, the E1 content percentage is preferably from 5% by mass to 90% by mass, and from the viewpoint of reduction of elastic modulus and improvement in reflow resistance, more preferably from 10% by mass to 80% by mass, and still more preferably from 20% by mass to 60% by mass.

Furthermore within the above range, as the E1 content percentage is higher, water absorption percentage tends to be reduced and flame retardancy tends to become excellent. Additionally, when the E1 content percentage is from 10% by mass to 80% by mass, reflow resistance, moldability, and flame retardancy can be simultaneously and sufficiently improved.

When the total amount of (E1) the arylamino group-containing alkoxysilane compound and (E2) the epoxy group-containing alkoxysilane compound in the epoxy resin molding material for sealing with respect to a total amount of (A) the epoxy resin in the epoxy resin molding material for sealing is regarded as "E1+E2 content percentage", the E1+E2 content percentage is not particularly limited as long as the advantageous effects of the present invention are not impaired. Above all, from the viewpoint of the balance between reflow resistance and respective characteristics, the E1+E2 content percentage is preferably from 1% by mass to 20% by mass, and from the viewpoint of reflow resistance, more preferably from 2% by mass to 15% by mass, and still more preferably from 4% by mass to 12% by mass.

Furthermore within the above range, as the "E1+E2 content percentage" is higher, fluidity tends to become excellent.

In the epoxy resin molding material for sealing, preferably, (E1) the arylamino group-containing alkoxysilane compound to be used is a silane compound of the general formula (I) in which $R^1$ and $R^2$ each independently represent an alkyl group having 1 to 4 carbon atoms, p represents 2 or 3, and q represents 3; (E2) the epoxy group-containing alkoxysilane compound to be used is at least one of a silane compound of the general formula (II) in which $R^1$ and $R^2$ represent an alkyl group having 1 to 4 carbon atoms, p represents 2 or 3, and q represents 3, or a silane compound of the general formula (III) in which $R^1$ and $R^2$ each independently represent an alkyl group having 1 to 4 carbon atoms, p represents 2 or 3, and q represents 2; the E1 content percentage is from 10% by mass to 80% by mass; and the E1+E2 content percentage is from 2% by mass to 15% by mass. More preferably, (E1) the arylamino group-containing alkoxysilane compound to be used is a silane compound of the general formula (I) in which $R^1$ and $R^2$ each independently represent a methyl group or an ethyl group, p represents 2 or 3, and q represents 3; (E2) the epoxy group-containing alkoxysilane compound to be used is at least one of a silane compound of the general formula (II) in which $R^1$ and $R^2$ each independently represent a methyl group or an ethyl group, p represents 2 or 3, and q represents 3, or a silane compound of the general formula (III) in which $R^1$ and $R^2$ each independently represent a methyl group or an ethyl group, p represents 2 or 3, and q represents 2; the E1 content percentage is from 20% by mass to 60% by mass; and the E1+E2 content percentage is from 4% by mass to 12% by mass.

In addition, when producing the epoxy resin molding material for sealing, a method for adding (E1) the arylamino group-containing alkoxysilane compound and (E2) the epoxy group-containing alkoxysilane compound is not particularly limited. For example, each of the compounds may be added alone, or (E1) the arylamino group-containing alkoxysilane compound and (E2) the epoxy group-containing alkoxysilane compound may be mixed together in advance and then added. In addition, when each of the compounds (E1) and (E2) is added alone, the order of addition of the compounds is not particularly limited.

(A) Epoxy Resin

The epoxy resin used in the present invention is not particularly limited as long as the resin is commonly used in epoxy resin molding materials for sealing. Among them, preferred are epoxy resins including two or more epoxy groups in one molecule thereof. Examples of such epoxy resins include novolac epoxy resins including phenol novolac epoxy resins, ortho-cresol novolac epoxy resins, and epoxy resins having a triphenylmethane structure, which are prepared by epoxidizing novolac resins obtained by condensation or co-condensation of at least one selected from a group consisting of phenols such as a phenol, a cresol, a xylenol, a resorcin, a catechol, a bisphenol A and a bisphenol F, and naphthols such as an α-naphthol, a β-naphthol and a dihydroxynaphthalene with an aldehyde group-containing compound such as a formaldehyde, an acetaldehyde, a propionaldehyde, a benzaldehyde or a salicylaldehyde in the presence of an acidic catalyst; epoxy resins that are diglycidyl ethers of alkyl-substituted, aromatic ring-substituted or unsubstituted bisphenol A, bisphenol F, bisphenol S, biphenol, thiodiphenol or the like; stilbene epoxy resins; hydroquinone epoxy resins; glycidyl ester epoxy resins obtained by reaction of polybasic acids such as phthalic acid and dimer acid with epichlorohydrin; glycidyl amine epoxy resins obtained by reaction of polyamines such as diaminodiphenylmethane and isocyanuric acid with epichlorohydrin; dicyclopentadiene epoxy resins obtained by epoxidizing co-condensed resins of dicyclopentadiene and phenols; naphthalene ring-containing epoxy resins; epoxides of aralkyl phenol resins such as phenol aralkyl resins and naphthol aralkyl resins synthesized from at least one of phenols or naphthols with dimethoxyparaxylene or bis(methoxymethyl)biphenyl; trimethylolpropane epoxy resins; terpene-modified epoxy resins; linear aliphatic epoxy resins obtained by oxidizing olefin bonds with peracids such as peracetic acid; and alicyclic epoxy resins. Any one of these may be used alone or two or more thereof may be used in combination.

Above all, from the viewpoint of achieving both fluidity and curability, the epoxy resin preferably includes a biphenyl epoxy resin that is a diglycidyl ether of an alkyl-substituted, aromatic ring-substituted, or unsubstituted biphenol. In addition, from the viewpoint of curability, the epoxy resin preferably includes a novolac epoxy resin, and from the viewpoint of low hygroscopicity, preferably includes a dicyclopentadiene epoxy resin. In addition, from the viewpoint of heat resistance and low warpage properties, the epoxy resin preferably includes a naphthalene epoxy resin, and from the viewpoint of achieving both fluidity and flame retardancy, preferably includes a bisphenol F epoxy resin that is a diglycidyl ether of an alkyl-substituted, aromatic-ring substituted, or unsubstituted bisphenol F. In addition, from the viewpoint of achieving both fluidity and reflow properties, the epoxy resin preferably includes a thiodiphenol epoxy resin that is a diglycidyl ether of an alkyl-substituted, aromatic ring-substituted, or unsubstituted thiodiphenol. In addition, from the viewpoint of achieving both curability and flame retardancy, the epoxy resin preferably includes an epoxide of a phenol aralkyl resin synthesized from an alkyl-substituted, aromatic ring-substituted, or unsubstituted phenol and dimethoxyparaxylene or bis (methoxymethyl)biphenyl. Additionally, from the viewpoint of achieving both preservation stability and flame retardancy, the epoxy resin preferably includes an epoxide of a naphthol aralkyl resin synthesized from an alkyl-substituted, aromatic ring-substituted, or unsubstituted naphthol and dimethoxyparaxylene.

Examples of the biphenyl epoxy resin include an epoxy resin represented by the following general formula (IV).

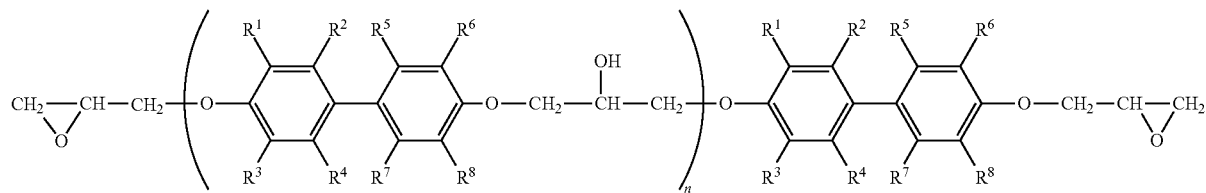

(IV)

Herein, in the general formula (IV), $R^1$ to $R^8$ each independently represent a hydrogen atom, a monovalent hydrocarbon group having 1 to 10 carbon atoms, or an alkoxy group having 1 to 10 carbon atoms; and n represents an integer from 0 to 3.

Specific examples of $R^1$ to $R^8$ in the general formula (IV) include a hydrogen atom; alkyl groups having 1 to 10 carbon atoms, such as a methyl group, an ethyl group, a propyl group, a butyl group, an isopropyl group, an isobutyl group, and a tert-butyl group; alkenyl groups having 1 to 10 carbon atoms such as a vinyl group, an allyl group, and a butenyl group; and alkoxy groups having 1 to 10 carbon atoms such as a methoxy group and an ethoxy groups. Among them, a hydrogen atom or a methyl group are preferable.

The biphenyl epoxy resin represented by the general formula (IV) is obtained by reacting a biphenyl compound with epichlorohydrin in a known method. Examples of such an epoxy resin include an epoxy resin including, as a main ingredient, 4,4-bis(2,3-epoxypropoxy)biphenyl or 4,4'-bis(2,3-epoxypropoxy)-3,3',5,5'-tetramethylbiphenyl and an epoxy resin obtained by reacting epichlorohydrin with 4,4'-biphenol or 4,4'-(3,3',5,5'-tetramethyl)biphenol. Particularly preferred is an epoxy resin including 4,4'-bis(2,3-epoxypropoxy)-3,3',5,5'-tetramethylbiphenyl as a main ingredient.

Examples of commercially available products of such an epoxy resin include YX-4000 and YL-6121H: trade names, manufactured by Mitsubishi Chemical Co., Ltd.

When the epoxy resin molding material for sealing includes the biphenyl epoxy resin, the content percentage of the biphenyl epoxy resin is preferably 20% by mass or more, more preferably 30% by mass or more, and still more preferably 50% by mass or more, in an amount of an entire epoxy resin in order to allow the epoxy resin to exhibit performance thereof.

Examples of the thiodiphenol epoxy resin include an epoxy resin represented by the following general formula (V).

Herein, in the general formula (V), $R^1$ to $R^8$ each independently represent a hydrogen atom, a monovalent hydrocarbon group having 1 to 10 carbon atoms, or an alkoxy group having 1 to 10 carbon atoms; and n represents an integer from 0 to 3.

Specific examples of $R^1$ to $R^8$ in the general formula (V) include a hydrogen atom; alkyl groups having 1 to 10 carbon atoms such as a methyl group, an ethyl group, a propyl group, a butyl group, an isopropyl group, an isobutyl group and a tert-butyl group; alkenyl groups having 1 to 10 carbon atoms such as a vinyl group, an allyl group, and a butenyl group; and alkoxy groups having 1 to 10 carbon atoms such as a methoxy group and an ethoxy groups. Among them, a hydrogen atom, a methyl group or a tert-butyl group are preferable.

The thiodiphenol epoxy resin represented by the general formula (V) is obtained by reacting a thiodiphenol compound with epichlorohydrin in a known method. Examples of such an epoxy resin include an epoxy resin including, as a main ingredient, a diglycidyl ether of 4,4'-dihydroxydiphenylsulfide, an epoxy resin including, as a main ingredient, a diglycidyl ether of 2,2',5,5'-tetramethyl-4,4'-dihydroxydiphenylsulfide, and an epoxy resin including, as a main ingredient, a diglycidyl ether of 2,2'-dimethyl-4,4'-dihydroxy-5,5'-di-tert-butyldiphenylsulfide. Among them, preferred is an epoxy resin including, as a main ingredient, an epoxy resin including, as a main ingredient, an diglycidyl ether of 2,2'-dimethyl-4,4'-dihydroxy-5,5'-di-tert-butyldiphenylsulfide. Examples of a commercially available product of such an epoxy resin include YSLV-120TE: trade name, manufactured by Nippon Steel Chemical Co., Ltd.

When the epoxy resin molding material for sealing includes the thiodiphenol epoxy resin, the content percentage of the thiodiphenol epoxy resin is 20% by mass or more, more preferably 30% by mass or more, and still more preferably 50% by mass or more, in the amount of the entire epoxy resin in order to allow the epoxy resin to exhibit performance thereof.

Examples of the bisphenol F epoxy resin include an epoxy resin represented by the following general formula (VI).

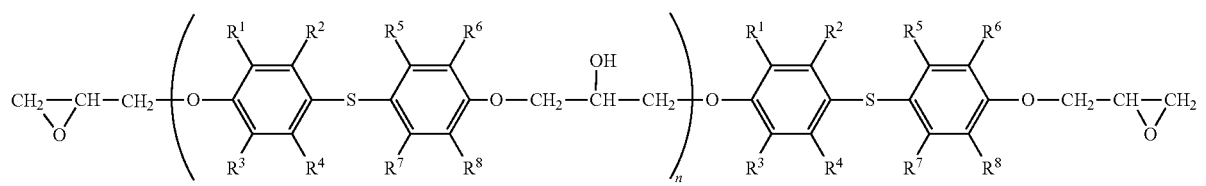

(V)

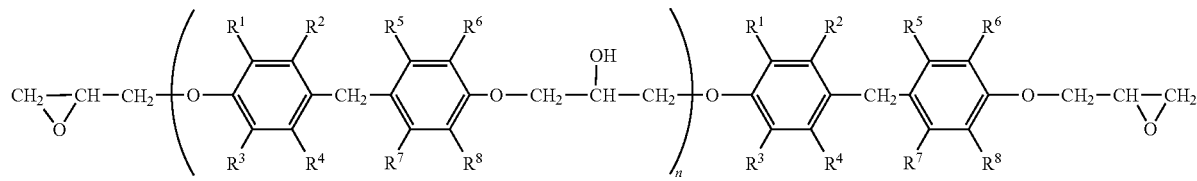

Herein, in the general formula (VI), $R^1$ to $R^8$ each independently represent a hydrogen atom, a monovalent hydrocarbon group having 1 to 10 carbon atoms, or an alkoxy group having 1 to 10 carbon atoms; and n represents an integer from 0 to 3.

Specific examples of $R^1$ to $R^8$ in the general formula (VI) include a hydrogen atom; alkyl groups having 1 to 10 carbon atoms such as a methyl group, an ethyl group, a propyl group, a butyl group, an isopropyl group, an isobutyl group and a tert-butyl group; alkenyl groups having 1 to 10 carbon atoms such as a vinyl group, an allyl group and a butenyl group; and alkoxy groups having 1 to 10 carbon atoms such as a methoxy group and an ethoxy group. Among them, a hydrogen atom or a methyl group are preferable.

The bisphenol F epoxy resin represented by the general formula (VI) is obtained by reacting a bisphenol F compound with epichlorohydrin in a known method. Examples of such an epoxy resin include an epoxy resin including, as a main ingredient, a diglycidyl ether of 4,4'-methylene bis(2,6-dimethylphenol), an epoxy resin including, as a main ingredient, a diglycidyl ether of 4,4'-methylene bis(2,3,6-trimethylphenol), and an epoxy resin including, as a main ingredient, a diglycidyl ether of 4,4'-methylenebisphenol. Among them, preferred is an epoxy resin including the diglycidyl ether of 4,4'-methylene bis(2,6-dimethylphenol) as a main ingredient. Examples of a commercially available product of such an epoxy resin include YSLV-80XY: trade name, manufactured by Nippon Steel Chemical Co., Ltd.

When the epoxy resin molding material for sealing includes the bisphenol F epoxy resin, the content percentage of the bisphenol F epoxy resin is 20% by mass or more, more preferably 30% by mass or more, and still more preferably 50% by mass or more, in the amount of the entire epoxy resin in order to allow the epoxy resin to exhibit performance thereof.

Examples of the novolac epoxy resin include an epoxy resin represented by the following general formula (VII).

Herein, in the general formula (VII), Rs each independently represent a hydrogen atom, a monovalent hydrocarbon group having 1 to 10 carbon atoms, or an alkoxy group having 1 to 10 carbon atoms; and n represents an integer from 0 to 10.

Among them, preferably, Rs in the general formula (VII) represent a hydrogen atom; alkyl groups having 1 to 10 carbon atoms such as a methyl group, an ethyl group, a propyl group, a butyl group, an isopropyl group and an isobutyl group; and alkoxy groups having 1 to 10 carbon atoms such as a methoxy group, an ethoxy group, a propoxy group and a butoxy group, and more preferably a hydrogen atom or a methyl group.

Preferably, n represents an integer from 0 to 3.

The novolac epoxy resin represented by the general formula (VII) is easily obtained by reacting a novolac phenol resin with epichlorohydrin. Among novolac epoxy resins represented by the general formula (VII), preferred is an ortho-cresol novolac epoxy resin. Examples of a commercially available product of such an epoxy resin include ESCN-190: trade name, manufactured by Sumitomo Chemical Co., Ltd.

When the epoxy resin molding material for sealing includes the novolac epoxy resin, the content percentage of the novolac epoxy resin is preferably 20% by mass or more and more preferably 30% by mass or more, in the amount of the entire epoxy resin in order to allow the epoxy resin to exhibit performance thereof.

Examples of the dicyclopentadiene epoxy resin include an epoxy resin represented by the following general formula (VIII).

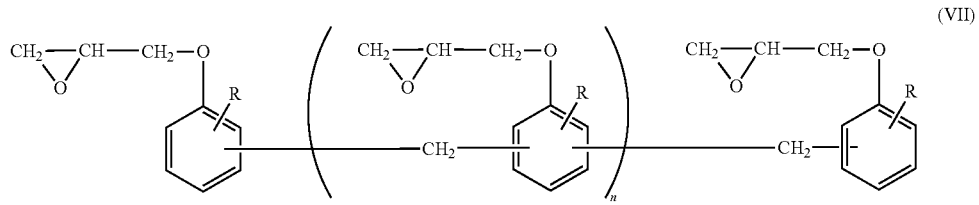

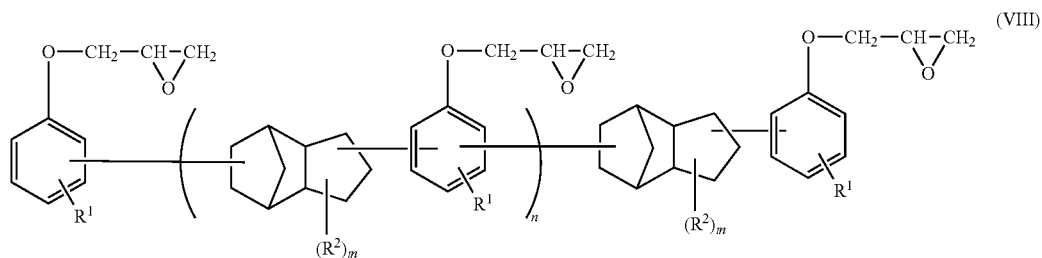

(VIII)

Herein, in the general formula (VIII), $R^1$s each independently represent a hydrogen atom or a monovalent hydrocarbon group having 1 to 10 carbon atoms; $R^2$s each independently represent a monovalent hydrocarbon group having 1 to 10 carbon atoms; n represents an integer from 0 to 10; and m represents an integer from 0 to 6.

Examples of $R^1$ in the general formula (VIII) include a hydrogen atom; and hydrocarbon groups having 1 to 10 carbon atoms, which include alkyl groups such as a methyl group, an ethyl group, a propyl group, a butyl group, an isopropyl group and a tert-butyl group, and alkenyl groups such as a vinyl group, an allyl group and a butenyl group. Particularly preferred are alkyl groups such as a methyl group and an ethyl group or a hydrogen atom, and more preferred are a methyl group or a hydrogen atom.

Examples of $R^2$ include unsubstituted monovalent hydrocarbon groups having 1 to 10 carbon atoms, which include alkyl groups such as a methyl group, an ethyl group, a propyl group, a butyl group, an isopropyl group and a tert-butyl group, and alkenyl groups such as a vinyl group, an allyl group and a butenyl group. Particularly, preferably, m represents 0.

When the epoxy resin molding material for sealing includes the dicyclopentadiene epoxy resin, the content percentage of the dicyclopentadiene epoxy resin is 20% by mass or more, and more preferably 30% by mass or more, in the amount of the entire epoxy resin in order to allow the epoxy resin to exhibit performance thereof.

Examples of the naphthalene epoxy resin include an epoxy resin represented by the following general formula (IX).

an integer from 0 to 3, j represents an integer from 0 to 2, and k represents an integer from 0 to 4, respectively.

Specific examples of $R^1$ to $R^3$ in the general formula (IX) include alkyl groups having 1 to 10 carbon atoms such as a methyl group, an ethyl group, a propyl group, a butyl group, an isopropyl group, an isobutyl group and a tert-butyl group; alkenyl groups having 1 to 10 carbon atoms such as a vinyl group, an allyl group and a butenyl group; and alkoxy groups having 1 to 10 carbon atoms such as a methoxy group and an ethoxy group. Particularly preferred are a methyl group and also, preferably, at least one of i, j and k represents 0.

Examples of the naphthalene epoxy resin represented by the general formula (IX) include random copolymers randomly including m pieces of constitutional units and n pieces of constitutional units, alternating copolymers alternately including m pieces of constitutional units and n pieces of constitutional units, copolymers regularly including m pieces of constitutional units and n pieces of constitutional units, and block copolymers including m pieces of constitutional units and n pieces of constitutional units in blocks. Any one of these copolymers may be used alone or two or more thereof may be used in combination. Examples of a commercially available product of such an epoxy resin include NC-7300: trade name, manufactured by Nippon Kayaku Co. Ltd.

When the epoxy resin molding material for sealing includes the naphthalene epoxy resin, the content percentage of the naphthalene epoxy resin is preferably 20% by mass or more, more preferably 30% by mass or more, and still more preferably 50% by mass or more, in the amount of the entire epoxy resin in order to allow the epoxy resin to exhibit performance thereof.

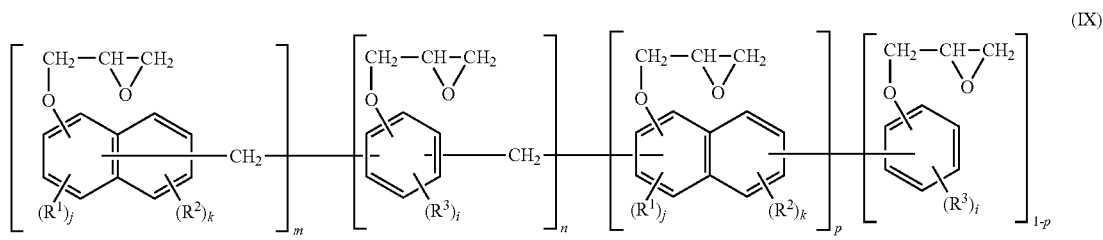

(IX)

Herein, in the general formula (IX), $R^1$ to $R^3$ each independently represent a monovalent hydrocarbon group having 1 to 12 carbon atoms or an alkoxy group having 1 to 10 carbon atoms; p represents 1 or 0; m and n each independently represent an integer from 0 to 11 and are selected so that (m+n) represents an integer from 1 to 11 and (m+p) represents an integer from 1 to 12. In addition, i represents Examples of the epoxide of the phenol aralkyl resin include an epoxy resin represented by the following general formula (X) and an epoxy resin represented by the following general formula (XI).

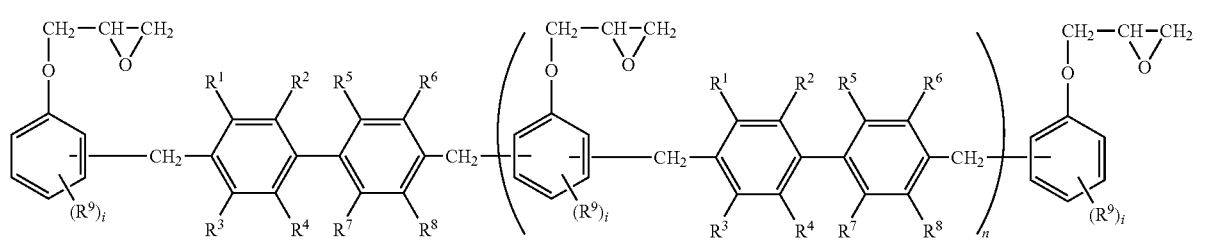

Herein, in the general formula (X), $R^1$ to $R^8$ each independently represent a hydrogen atom or a monovalent hydrocarbon group having 1 to 12 carbon atoms; $R^9$ each independently represents a monovalent hydrocarbon group having 1 to 12 carbon atoms; i represents an integer from 0 to 3; and n represents an integer from 0 to 10.

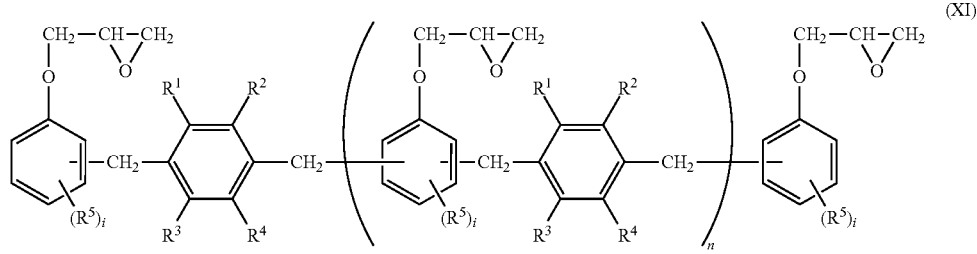

Herein, in the general formula (X), $R^1$ to $R^4$ each independently represent a hydrogen atom or a monovalent hydrocarbon group having 1 to 12 carbon atoms; $R^5$ each independently represents a monovalent hydrocarbon group having 1 to 12 carbon atoms; i represents an integer from 0 to 3; and n represents an integer from 0 to 10.

The epoxide of the biphenylene structure-containing phenol aralkyl resin represented by the general formula (X) is obtained by reacting a phenol aralkyl resin synthesized from an alkyl-substituted, aromatic ring-substituted, or unsubstituted phenol and bis(methoxymethyl)biphenyl with epichlorohydrin in a known method.

Examples of the monovalent hydrocarbon group represented by $R^1$ to $R^9$ in the general formula (X) include chain alkyl groups such as a methyl group, an ethyl group, a propyl group, an isopropyl group, an n-butyl group, a sec-butyl group, a tert-butyl group, a pentyl group, a hexyl group, an octyl group, a decyl group and a dodecyl group; cyclic alkyl groups such as a cyclopentyl group, a cyclohexyl group, a cycloheptyl group, a cyclopentenyl group and a cyclohexenyl group; aryl group-substituted alkyl groups substituted by aryl groups such as a benzyl group and a phenetyl group; alkoxy group-substituted alkyl groups such as methoxy group-substituted alkyl groups, ethoxy group-substituted alkyl groups and butoxy group-substituted alkyl groups; amino group-substituted alkyl groups such as aminoalkyl groups, dimethylaminoalkyl groups and diethylaminoalkyl groups; hydroxyl group-substituted alkyl groups; nonsubstituted aryl groups such as a phenyl group, a naphthyl group and a biphenyl group; alkyl group-substituted aryl groups such as tolyl group, a dimethylphenyl group, an ethylphenyl group, a butylphenyl group, a tert-butylphenyl group and a dimethylnaphthyl group; alkoxy group-substituted aryl groups such as a methoxyphenyl group, an ethoxyphenyl group, a butoxyphenyl group, a tert-butoxyphenyl group and a methoxynaphtyl group; amino group-substituted aryl groups substituted by amino groups such as a dimethylamino group and a diethylamino group; and hydroxyl group-substituted aryl groups. Among them, preferred are a methyl group. In addition, also preferably, $R^1$ to $R^8$ represent a hydrogen atom, and preferably, i represents 0.

Additionally, in the general formula (X), more preferably, n represents 6 or less on average.

Examples of a commercially available product of such an epoxy resin include NC-3000S: trade name, manufactured by Nippon Kayaku Co., Ltd.

In addition, from the viewpoint of achieving the balance between flame retardancy, reflow resistance, and fluidity, combination with the epoxy resin represented by the general formula (IV) is preferable. Particularly, more preferably, an epoxy resin of the general formula (X) in which $R^1$ to $R^8$ represent a hydrogen atom and i represents 0 is used in combination with an epoxy resin of the general formula (IV) in which $R^1$ to $R^8$ represent a hydrogen atom and n represents 0. In addition, particularly, a content mass ratio of the resins is preferably (IV)/(X)=from 50/50 to 5/95, more preferably from 40/60 to 10/90, and still more preferably from 30/70 to 15/85. Examples of a commercially available of a compound satisfying such a content mass ratio include CER-3000L (trade name, manufactured by Nippon Kayaku Co., Ltd).

The epoxide of the phenol aralkyl resin represented by the general formula (XI) is obtained by reacting epichlorohydrin with a phenol aralkyl resin synthesized from an alkyl-substituted, aromatic ring-substituted, or unsubstituted phenol and dimethoxyparaxylene in a known method.

Examples of the monovalent hydrocarbon group represented by $R^1$ to $R^5$ in the general formula (XI) include chain alkyl groups such as a methyl group, an ethyl group, a propyl group, an isopropyl group, an n-butyl group, a sec-butyl group, a tert-butyl group, a pentyl group, a hexyl group, an octyl group, a decyl group and a dodecyl group; cyclic alkyl groups such as a cyclopentyl group, a cyclohexyl group, a cycloheptyl group, a cyclopentenyl group and a cyclohexenyl group; aryl group-substituted alkyl groups substituted by aryl groups such as a benzyl group and a phenetyl group; alkoxy group-substituted alkyl groups such as methoxy group-substituted alkyl groups, ethoxy group-substituted alkyl groups and butoxy group-substituted alkyl groups; amino group-substituted alkyl groups such as aminoalkyl groups, dimethylaminoalkyl groups and diethylaminoalkyl groups; hydroxyl group-substituted alkyl groups; nonsubstituted aryl groups such as a phenyl group, a naphthyl group and a biphenyl group; alkyl group-substituted aryl groups such as a tolyl group, a dimethylphenyl group, an ethylphenyl group, a butylphenyl group, a tert-butylphenyl group and a dimethylnaphthyl group; alkoxy group-substituted aryl groups such as a methoxyphenyl group, an ethoxyphenyl group, a butoxyphenyl group, a tert-butoxyphenyl group and a methoxynaphtyl group; amino group-substituted aryl groups substituted by amono groups such as a dimethylamino group and a diethylamino group; and hydroxyl group-substituted aryl groups. Among them, preferred is a methyl group. Additionally, preferably, $R^1$ to $R^4$ represent a hydrogen atom, and preferably, i represents 0. In addition, in the general formula (XI), more preferably, n represents 6 or less on average. Examples of a commercially available product of such an epoxy resin include NC-2000L: trade name, manufactured by Nippon Kayaku Co., Ltd.

When the epoxy resin molding material for sealing includes the epoxide of the phenol aralkyl resin, the content percentage of the epoxide thereof is preferably 20% by mass or more, and more preferably 30% by mass or more, in the amount of the entire epoxy resin in order to allow the epoxide to exhibit performance thereof.

Examples of the epoxide of the naphthol aralkyl resin include an epoxy resin represented by the following general formula (XII).

The epoxide of the naphthol aralkyl resin represented by the general formula (XII) is obtained by reacting a naphthol aralkyl resin synthesized from an alkyl-substituted, aromatic ring-substituted, or unsubstituted naphthol and dimethoxyparaxylene or bis(methoxymethyl)biphenyl with epichlorohydrin in a known method.

Examples of R in the general formula (XII) include chain alkyl groups such as a methyl group, an ethyl group, a propyl group, an isopropyl group, an n-butyl group, a sec-butyl group, a tert-butyl group, a pentyl group, a hexyl group, an octyl group, a decyl group and a dodecyl group; cyclic alkyl groups such as a cyclopentyl group, a cyclohexyl group, a cycloheptyl group, a cyclopentenyl group, and a cyclohexenyl group; aryl group-substituted alkyl groups such as a benzyl group and a phenetyl group; alkoxy group-substituted alkyl groups such as methoxy group-substituted alkyl groups, ethoxy group-substituted alkyl groups and butoxy group-substituted alkyl groups; amino group-substituted alkyl groups such as aminoalkyl groups, dimethylaminoalkyl groups and diethylaminoalkyl groups; hydroxyl group-substituted alkyl groups; nonsubstituted aryl groups such as a phenyl group, a naphthyl group and a biphenyl group; alkyl group-substituted aryl groups such as a tolyl group, a dimethylphenyl group, an ethylphenyl group, a butylphenyl group, a tert-butylphenyl group, and a dimethylnaphthyl group; alkoxy group-substituted aryl groups such as a methoxyphenyl group, an ethoxyphenyl group, a butoxyphenyl group, a tert-butoxyphenyl group and a methoxynaphtyl group; amino group-substituted aryl groups substituted by amino groups such as a dimethylamino group and a diethylamino group; and hydroxyl group-substituted aryl groups. Among them, preferred are a methyl group, and also preferably, i represents 0.

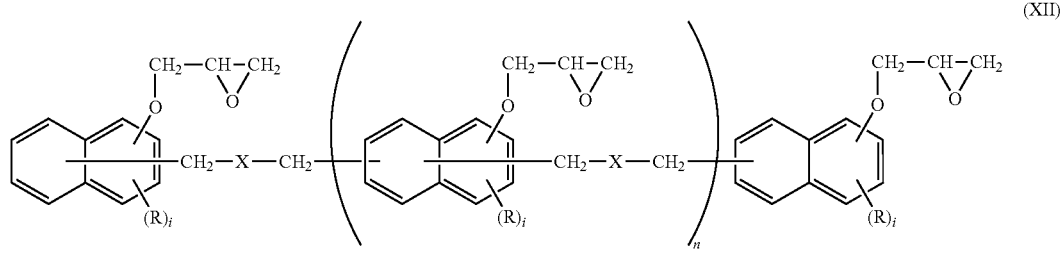

In the general formula (XII), Rs each independently represent a monovalent hydrocarbon group having 1 to 12 carbon atoms; i represents an integer from 0 to 3; X represents a divalent organic group including an aromatic ring; and n represents an integer from 0 to 10.

Examples of X include arylene groups such as a phenylene group, a biphenylene group and a naphthylene group; alkyl group-substituted arylene groups such as a tolylene group; alkoxy group-substituted arylene groups; aralkyl group-substituted arylene groups; divalent organic groups derived from aralkyl groups such as a benzyl group and a phenetyl group; and divalent organic groups including an arylene group such as a xylylene group. Among them, from the viewpoint of achieving both flame retardancy and preservation stability, a phenylene group and a biphenylene group are preferred.

n represents 0 or an integer from 1 to 10, and more preferably, represents 6 or less on average.

Specific examples of the epoxide of the naphthol aralkyl resin represented by the general formula (XII) include an epoxide of a naphthol aralkyl resin represented by the following general formula (XIII) and an epoxide of a naphthol aralkyl resin represented by the following general formula (XIV). Examples of a commercially available product of the epoxy resin represented by the general formula (XIII) include ESN-375: trade name, manufactured by Nippon Steel Chemical Co., Ltd., and examples of a commercially available product of the epoxy resin represented by the general formula (XIV) include ESN-175: trade name, manufactured by Nippon Steel Chemical Co., Ltd.

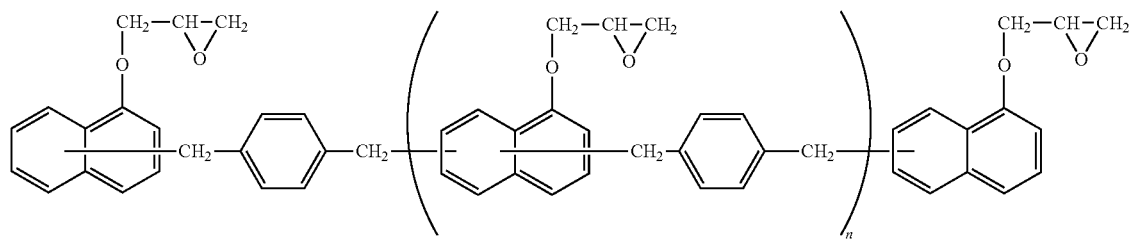

(XIII)

Herein, in the general formula (XIII), n represents an integer from 0 to 10.

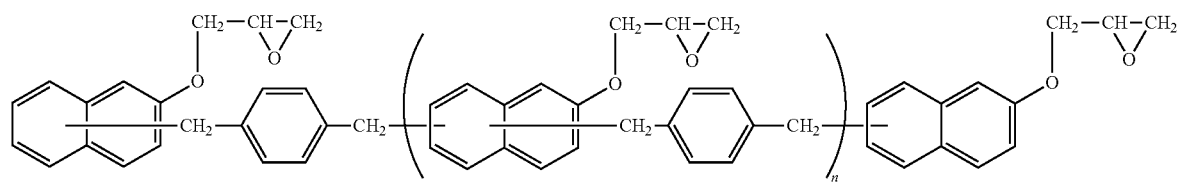

(XIV)

Herein, in the general formula (XIV), n represents an integer from 0 to 10.

When the epoxy resin molding material for sealing includes the epoxide of the naphthol aralkyl resin, the content percentage of the epoxide of the naphthol aralkyl resin is 20% by mass or more, more preferably 30% by mass or more, and still more preferably 50% by mass or more, in the amount of the entire epoxy resin in order to allow the epoxide to exhibit performance thereof.

In addition, in the epoxy resin molding material for sealing, the epoxy resin (A) may also be an epoxy resin represented by the following structural formula (XV).

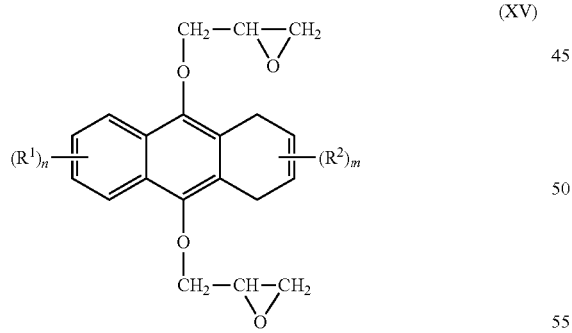

(XV)

In the general formula (XV), $R^1$ and $R^2$ each independently represent a hydrocarbon group having 1 to 12 carbon atoms or an alkoxy group having 1 to 12 carbon atoms; n represents an integer from 0 to 4; and m represents an integer from 0 to 2.

Examples of the epoxy resin represented by the general formula (XV) include epoxy resins represented by the following general formulas (XVI) to (XXXIV).

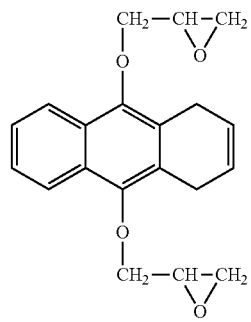

(XVI)

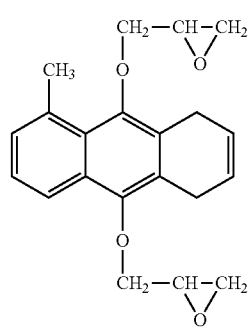

(XVII)

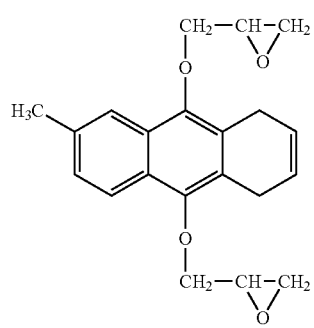

(XVIII)

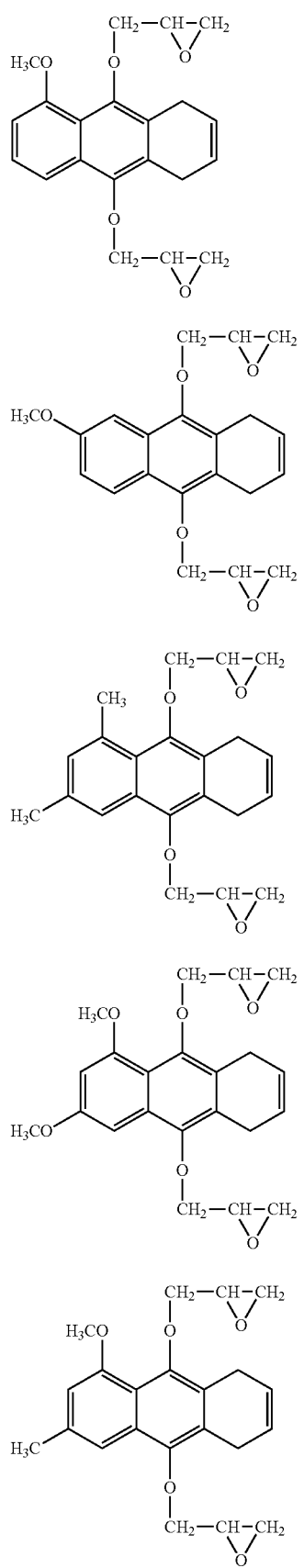
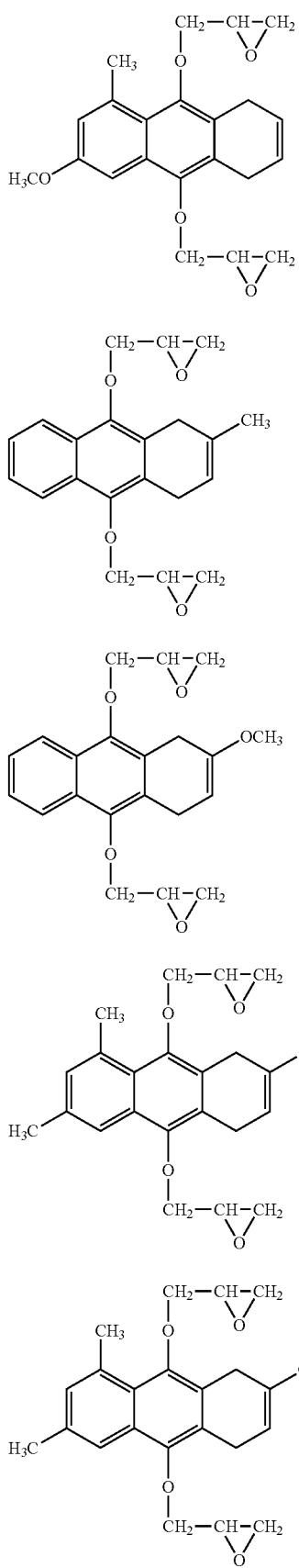

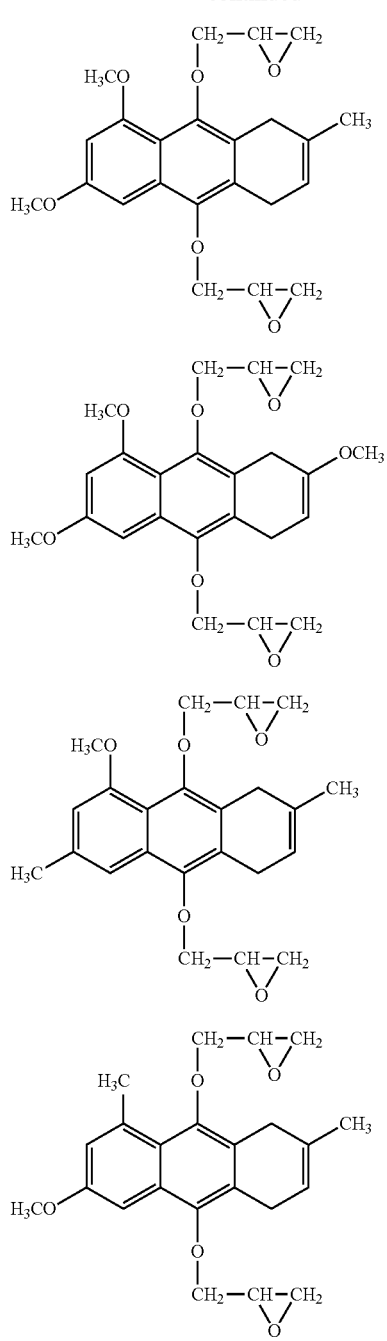

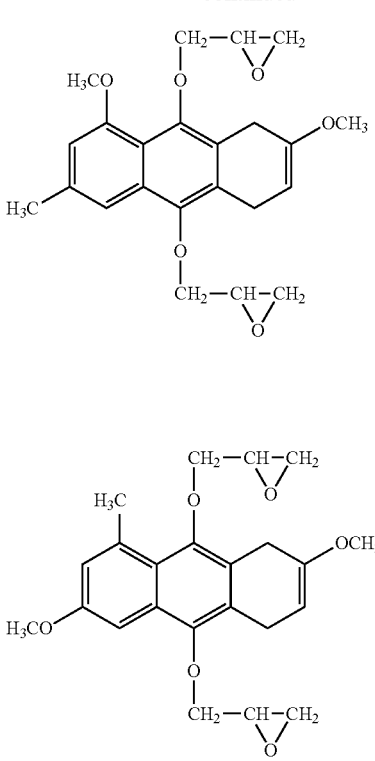

Among the epoxy resins represented by the general formula (XV), from the viewpoint of flame retardancy and moldability, preferred is the epoxy resin represented by the general formula (XVI). Examples of such a compound available include YX-8800 (trade name, manufactured by Mitsubishi Chemical Co. Ltd).

When the epoxy resin molding material for sealing includes the epoxy resin represented by the general formula (XVI), the content percentage of the epoxy resin is preferably 30% by mass or more, more preferably 50% by mass or more, and still more preferably 60% by mass or more, in an amount of an entire epoxy resin in order to allow the epoxy resin in order to allow the epoxy resin to exhibit performance thereof from various viewpoints.

Additionally, in the epoxy resin molding material for sealing, the epoxy resin (A) may also be an epoxy resin represented by the following structural formula (XXXXV).

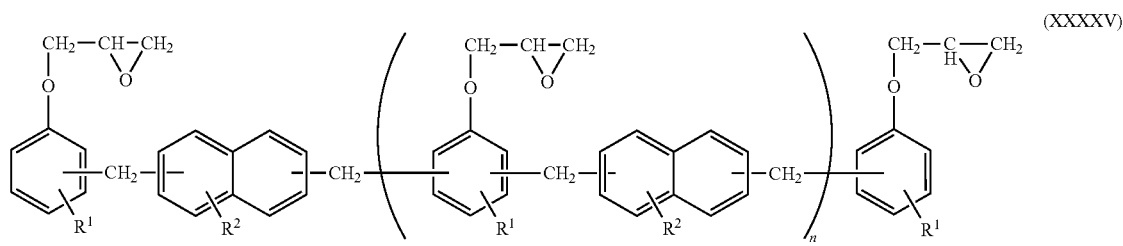

In the general formula (XXXXV), $R^1$ and $R^2$ each independently represent a hydrocarbon group having 1 to 12 carbon atoms or an alkoxy group having 1 or 2 carbon atoms; and n represents an integer from 0 to 10.

Examples of $R^1$ and $R^2$ in the general formula (XXXXV) include chain alkyl groups such as a methyl group, an ethyl group, a propyl group, an isopropyl group, an n-butyl group, a sec-butyl group, a tert-butyl group, a pentyl group, a hexyl group, an octyl group, a decyl group and a dodecyl group; cyclic alkyl groups such as a cyclopentyl group, a cyclohexyl group, a cycloheptyl group, a cyclopentenyl group and a cyclohexenyl group; benzyl group; a phenetyl group; alkoxyl groups such as a methoxy group and an ethoxy group. Among them, preferably, $R^1$ represents a methyl group and $R^2$ represents a methoxy group. Examples of such a compound include trade name: HP-5000 manufactured by DIC Co., Ltd.

When the epoxy resin molding material for sealing includes the epoxy resin represented by the general formula (XXXXV), the content percentage of the epoxy resin represented by the general formula (XXXXV) is preferably 20% by mass or more, more preferably 30% by mass or more, and still more preferably 50% by mass or more, in the amount of the entire epoxy resin in order to allow the epoxy resin to exhibit performance thereof.

The epoxy equivalent weight of the epoxy resin is not particularly limited. Particularly, from the viewpoint of the balance between the various characteristics such as moldability, reflow resistance, and electrical reliability, the epoxy equivalent weight thereof is preferably from 100 g/eq to 1000 g/eq., and more preferably from 150 g/eq to 500 g/eq.

In addition, the softening point or melting point of the epoxy resin is not particularly limited. Particularly, from the viewpoint of moldability and reflow resistance, the softening point or melting point thereof is preferably from 40° C. to 180° C., and from the viewpoint of handleability during producing the epoxy resin molding material for sealing, more preferably from 50° C. to 130° C.

The content percentage of the epoxy resin (A) in the epoxy resin molding material for sealing is not particularly limited. From the viewpoint of the balance between the various characteristics such as moldability, reflow resistance, and electrical reliability, the content percentage thereof is preferably from 0.4% by mass to 28% by mass, and more preferably from 1.1% by mass to 26% by mass, in a total mass of the epoxy resin molding material for sealing.

(B) Curing Agent

The epoxy resin molding material for sealing includes at least one curing agent. The curing agent is not particularly limited as long as the agent is commonly used in epoxy resin molding materials for sealing. Examples of the curing agent include a novolac phenol resin obtained by condensation or co-condensation of at least one selected from a group consisting of phenols such as a phenol, a cresol, a xylenol, a resorcin, a catechol, a bisphenol A, a bisphenol F, a phenylphenol, a thiodiphenol and aminophenol, and naphthols such as an α-naphthol, a β-naphthol, and a dihydroxynaphthalene with a compound having an aldehyde group such as a formaldehyde, a benzaldehyde or a salicylaldehyde in the presence of an acidic catalyst; a phenol aralkyl resin synthesized from at least one selected from a group consisting of phenols and naphthols with a dimethoxyparaxylene or a bis(methoxymethyl)biphenyl; an aralkyl phenol resin such as a naphthol aralkyl resin; a copolymer phenol aralkyl resin including phenol novolac structures and phenol aralkyl structures repeating randomly, in blocks or alternately; a paraxylylene-modified phenol resin; a metaxylylene-modified phenol resin; a melamine-modified phenol resin; a terpene-modified phenol resin; a dicyclopentadiene-modified phenol resin; a cyclopentadiene-modified phenol resin; a cyclopentadiene-modified phenol resin; and a polycyclic aromatic ring-modified phenol resin. Any one of these may be used alone or two or more thereof may be used in combination.

Among them, from the viewpoint of fluidity, flame retardancy, and reflow resistance, a phenol aralkyl resin and a naphthol aralkyl resin are preferable. In addition, from the viewpoint of low hygroscopicity, a dicyclopentadiene-modified phenol resin is preferable. In addition, from the viewpoint of curability, a novolac phenol resin is preferable. Preferably, the curing agent includes at least one of the phenol resins.

Examples of the phenol aralkyl resins include a resin represented by the following general formula (XXXV).

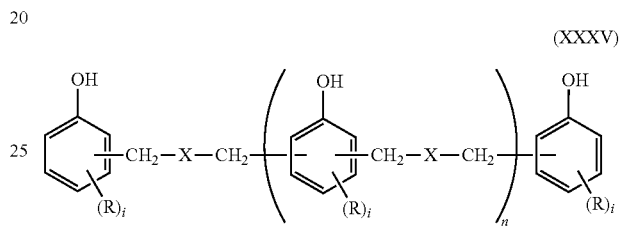

(XXXV)

In the general formula (XXXV), Rs each independently represent a substituted or unsubstituted monovalent hydrocarbon group having 1 to 12 carbon atoms; i represents an integer from 0 to 3; X represents a divalent organic group including an aromatic ring; and n represents an integer from 0 to 10. Examples of a substituent in the hydrocarbon group include an aryl group, an alkoxy group, an amino group and a hydroxyl group.

Specific examples of R in the general formula (XXXV) include chain and branched chain alkyl groups such as a methyl group, an ethyl group, a propyl group, an isopropyl group, an n-butyl group, a sec-butyl group, a tert-butyl group, a pentyl group, a hexyl group, an octyl group, a decyl group and a dodecyl group; cyclic alkyl groups such as a cyclopentyl group, a cyclohexyl group, a cycloheptyl group, a cyclopentenyl group and a cyclohexenyl group; aryl group-substituted alkyl groups such as a benzyl group and a phenetyl group; alkoxy group-substituted alkyl groups such as methoxy group-substituted alkyl groups, ethoxy group-substituted alkyl groups and butoxy group-substituted alkyl groups; amino group-substituted alkyl groups such as aminoalkyl groups, dimethylaminoalkyl groups and diethylaminoalkyl groups; hydroxyl group-substituted alkyl groups; nonsubstituted aryl groups such as a phenyl group, a naphthyl group and a biphenyl group; alkyl group-substituted aryl groups such as a tolyl group, a dimethylphenyl group, an ethylphenyl group, a butylphenyl group, a tert-butylphenyl group and a dimethylnaphthyl group; alkoxy group-substituted aryl groups such as a methoxyphenyl group, an ethoxyphenyl group, a butoxyphenyl group, a tert-butoxyphenyl group and a methoxynaphtyl group; amino group-substituted aryl groups substituted by amino groups such as a dimethylamino group and a diethylamino group; and hydroxyl group-substituted aryl groups. Among them, preferably, R represents a methyl group, and also preferably i represents 0.

X represents a divalent organic group including an aromatic ring. Specific examples thereof include arylene groups such as a phenylene group, a biphenylene group and a naphthylene group; alkyl group-substituted arylene groups such as a tolylene group; alkoxy group-substituted arylene groups; divalent organic groups derived from aralkyl groups such as a benzyl group and a phenetyl group; and divalent organic groups including arylene groups such as aralkyl group-substituted arylene groups and xylylene groups. Among them, from the viewpoint of achieving both flame retardancy and reflow resistance, preferred are substituted or unsubstituted biphenylene groups, such as a phenol aralkyl resin represented by the following general formula (XXXVI). In addition, from the viewpoint of achieving the balance between flame retardancy, fluidity, and curability, preferred are substituted or unsubstituted phenylene groups, such as a phenol aralkyl resin represented by the following general formula (XXXVII).

In the following general formulas (XXXVI) and (XXXVII), n represents an integer from 0 to 10 and preferably represents 6 or less on average.

represents an integer from 0 to 3; X represents a divalent organic group including an aromatic ring; and n represent an integer from 0 to 10. Examples of a substituent in the hydrocarbon group include an aryl group, an alkoxy group, an amino group, and a hydroxyl gorup.

Specific examples of R in the general formula (XXXVIII) include chain and branched chain alkyl groups such as a methyl group, an ethyl group, a propyl group, an isopropyl group, an n-butyl group, a sec-butyl group, a tert-butyl group, a pentyl group, a hexyl group, an octyl group, a decyl group and a dodecyl group; cyclic alkyl groups such as a cyclopentyl group, a cyclohexyl group, a cycloheptyl group, a cyclopentenyl group and a cyclohexenyl group; aryl group-substituted alkyl groups such as a benzyl group and a phenetyl group; alkoxy group-substituted alkyl groups such as methoxy group-substituted alkyl groups, ethoxy group-substituted alkyl groups and butoxy group-substituted alkyl groups; amino group-substituted alkyl groups substituted by amino groups such as aminoalkyl groups, dimethylamino-

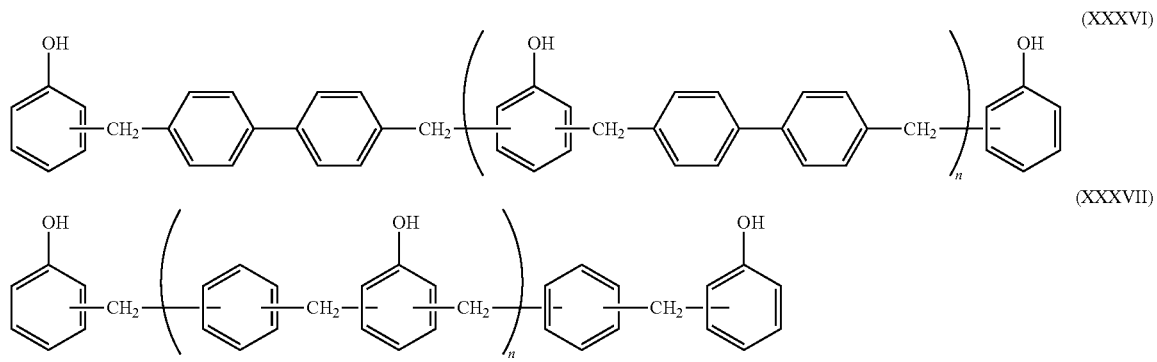

Examples of a commercially available product of the biphenylene structure-containing phenol aralkyl resin represented by the general formula (XXXVI) include MEH-7851: trade name, manufactured by Meiwa Plastic Industries Ltd. In addition, examples of a commercially available product of the phenol aralkyl resin represented by the general formula (XXXVII) include XLC: trade name, manufactured by Mitsui Chemicals Inc.

When the epoxy resin molding material for sealing includes the phenol aralkyl resin as the curing agent, the content percentage of the phenol aralkyl resin is preferably 20% by mass or more, more preferably 30% by mass or more, and still more preferably 50% by mass or more, in an amount of an entire curing agent in order to allow the resin to exhibit performance thereof.

Examples of the naphthol aralkyl resin include a resin represented by the following general formula (XXXVIII).

alkyl groups and diethylaminoalkyl groups; hydroxyl group-substituted alkyl groups; nonsubstituted aryl groups such as a phenyl group, a naphthyl group and a biphenyl group; alkyl group-substituted aryl groups such as a tolyl group, a dimethylphenyl group, an ethylphenyl group, a butylphenyl group, a tert-butylphenyl group and a dimethylnaphthyl group; alkoxy group-substituted aryl groups such as a methoxyphenyl group, an ethoxyphenyl group, a butoxyphenyl group, a tert-butoxyphenyl group and a methoxynaphtyl group; amino group-substituted aryl groups substituted by amino groups such as a dimethylamino group and a diethylamino group; and hydroxyl group-substituted aryl groups. Among them, preferably, R represents a methyl group. Additionally, preferably, i represents 0.

X represents a divalent organic group including an aromatic ring. Specific examples thereof include arylene groups such as a phenylene group, a biphenylene group and a

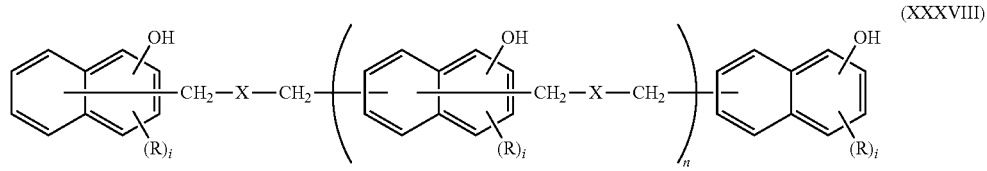

Herein, in the general formula (XXXVIII), Rs each independently represent a substituted or unsubstituted monovalent hydrocarbon group having 1 to 12 carbon atoms; i naphthylene group; alkyl group-substituted arylene groups such as a tolylene group; alkoxy group-substituted arylene groups; aralkyl group-substituted arylene groups; divalent organic groups derived from aralkyl groups such as a benzyl group and a phenetyl group; and divalent organic groups including arylene groups such as a xylylene group. Among them, from the viewpoint of preservation stability and flame retardancy, substituted or unsubstituted phenylene groups and biphenylene groups are preferable, and a phenylene group is more preferable. Examples of such a naphthol aralkyl resin include a naphthol aralkyl resin represented by the following general formula (XXXIX) and a naphthol aralkyl resin represented by the following general formula (XXXX). In the following general formulas (XXXIX) and (XXXX), n represents an integer from 0 to 10 and more preferably represents 6 or less on average.

When the softening point of the polymer is 60° C. or more, bleeding thereof during molding tends to be suppressed, thus improving moldability. In addition, when the softening point thereof is 150° C. or less, compatibility with the epoxy resin and the curing agent tends to be improved.

Examples of the other aromatic olefin to be copolymerized with acenaphthylene include styrene, α-methylstyrene, indene, benzothiophene, benzofuran, vinylnaphthalene, vinylbiphenyl, or alkyl substitution products thereof. In addition, besides the above aromatic olefins, aliphatic olefin can be used in combination in a range not impairing the advantageous effects of the present invention. Examples of

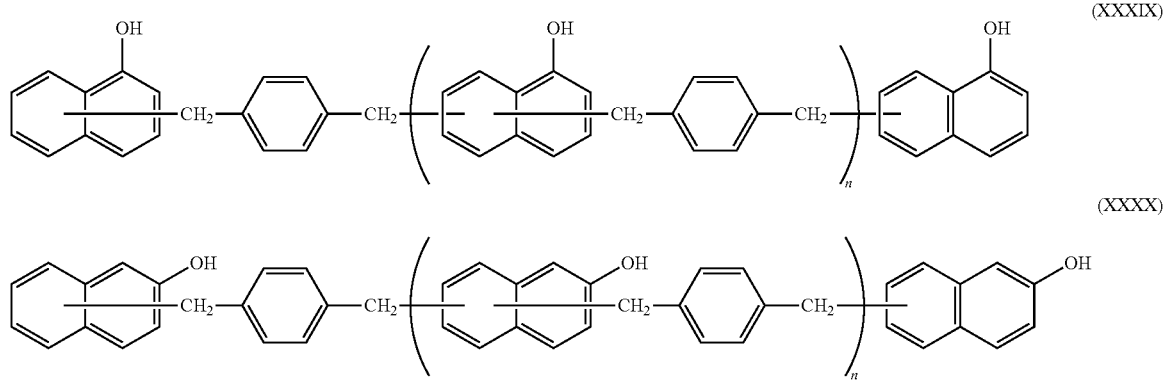

Examples of a commercially available product of the naphthol aralkyl resin represented by the general formula (XXXIX) include SN-475: trade name, manufactured by Nippon Steel Chemical Co., Ltd. In addition, examples of a commercially available product of the naphthol aralkyl resin represented by the general formula (XXXX) include SN-170: trade name, manufactured by Nippon Steel Chemical Co., Ltd.

When the epoxy resin molding material for sealing includes the naphthol aralkyl resin as the curing agent, the content percentage of the naphthol aralkyl resin is preferably 20% by mass or more, more preferably 30% by mass or more, and still more preferably 50% by mass or more, in the amount of the entire curing agent in order to allow the resin to exhibit performance thereof.

Preferably, the phenol aralkyl resin represented by the general formula (XXXV) and the naphthol aralkyl resin represented by the general formula (XXXVIII) are partially or entirely pre-mixed with a polymerizable monomer such as acenaphthylene. Acenaphthylene can be obtained by dehydrogenation of acenaphthene, but a commercially available product thereof may be used. In addition, instead of acenaphthylene, a polymer of acenaphthylene or a polymer of acenaphthylene and another aromatic olefin can be used. Examples of a method for obtaining a polymer of acenaphthylene or a polymer of acenaphthylene and another aromatic olefin include radical polymerization, cationic polymerization, and anionic polymerization. In polymerization, a conventionally known catalyst can be used, but only heat can be used without any catalyst. In this case, polymerization temperature is preferably from 80° C. to 160° C., and more preferably from 90° C. to 150° C. The polymer of acenaphthylene obtained or the polymer of acenaphthylene and another aromatic olefin obtained has a softening point of preferably from 60° C. to 150° C. and more preferably from 70° C. to 130° C.

the aliphatic olefin include (meth)acrylic acids and esters thereof, maleic anhydride, itaconic anhydride, fumaric acid, and esters thereof.

An amount of addition of the aliphatic olefins is preferably 20% by mass or less, and more preferably 9% by mass or less in a total amount of polymerizable monomers used in pre-mixing with the phenol aralkyl resin and the naphthol aralkyl resin.

Examples of a method that can pre-mix a part or all of the curing agent with acenaphthylene include a method in which the curing agent and acenaphthylene, respectively, are pulverized minutely and mixed together in their solid states by a mixer or the like, a method in which both of the ingredients are evenly dissolved in a solvent for dissolving both thereof and then the solvent is removed, and a method in which both of the ingredients are fused and mixed together at a temperature not less than a softening point of at least one of the curing agent and acenaphthylene. Among them, the fusing and mixing method is preferable, since an evenly blended mixture can be obtained and impurity mixing is reduced.

By the above method, a pre-mixture (an acenaphthylene-modified curing agent) is produced. There is no particular limitation to the fusion and mixing as long as the temperature for the fusion and mixing is not less than a softening point of the at least one of the curing agent and acenaphthylene. Particularly, the temperature is preferably from 100° C. to 250° C., and more preferably from 120° C. to 200° C. In addition, as long as both of the ingredients are evenly mixed together, the time for the fusion and mixing is not particularly limited, but preferably from one hour to 20 hours, and more preferably from two hours to 15 hours. When pre-mixing the curing agent and acenaphthylene, it does not matter that acenaphthylene is polymerized or reacts with the curing agent during the mixing.

Examples of the dicyclopentadiene phenol resin (the dicyclopentadiene-modified phenol resin) include a phenol resin represented by the following general formula (XXXXI).

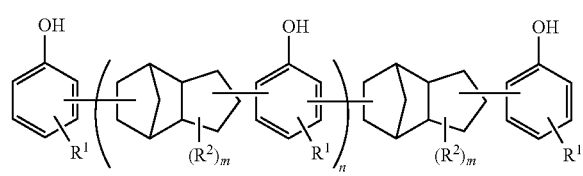

(XXXXI)

Herein, in the general formula (XXXXI), $R^1$s each independently represent a hydrogen atom or a substituted or unsubstituted monovalent hydrocarbon group having 1 to 10 carbon atoms; $R^2$s each independently represent a substituted or unsubstituted monovalent hydrocarbon group having 1 to 10 carbon atoms; n represents an integer from 0 to 10; and m represents an integer from 0 to 6. Examples of substituents in the hydrocarbon groups include a halogen atom, an amino group and a sulfanyl group.

Specific examples of $R^1$ in the general formula (XXXXI) include a hydrogen atom; substituted or unsubstituted monovalent hydrocarbon groups having 1 to 10 carbon atoms such as alkyl groups such as a methyl group, an ethyl group, a propyl group, a butyl group, an isopropyl group and a tert-butyl group; alkenyl groups such as a vinyl group, an allyl group and a butenyl group; halogenated alkyl groups, amino group-substituted alkyl groups, and sulfanyl group-substituted alkyl groups. Among them, alkyl groups such as a methyl group and an ethyl group and a hydrogen atom are preferable, and a methyl group and a hydrogen atom are more preferable. Specific examples of $R^2$ include substituted or unsubstituted monovalent hydrocarbon groups having 1 to 10 carbon atoms such as alkyl groups such as a methyl group, an ethyl group, a propyl group, a butyl group, an isopropyl group and a tert-butyl group, alkenyl groups such as a vinyl group, an allyl group and a butenyl group, and halogenated alkyl groups, amino group-substituted alkyl groups, and sulfanyl group-substituted alkyl groups. m represents an integer from 0 to 6, but preferably represents 0.

Examples of a commercially available product of the dicyclopentadiene phenol resin in which $R^1$ represents a hydrogen atom and m represents 0 include DPP (trade name, manufactured by Nippon Petrochemicals Co., Ltd).

When the epoxy resin molding material for sealing includes the dicyclopentadiene phenol resin, the content percentage of the dicyclopentadiene phenol epoxy resin is preferably 20% by mass or more, more preferably 30% by mass or more, and still more preferably 50% by mass or more, in the amount of the entire curing agent in order to allow the resin to exhibit performance thereof.

Examples of the novolac phenol resin include a novolac phenol resin such as a phenol resin represented by the following general formula (XXXXII) and a cresol novolac resin. Particularly preferred is a novolac phenol resin represented by the following general formula (XXXXII).

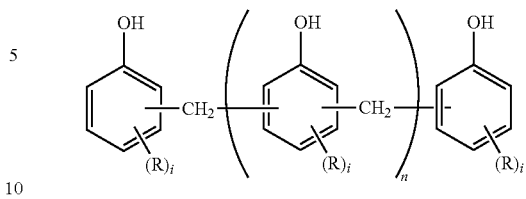

(XXXXII)

Herein, in the general formula (XXXXII), R represents a substituted or unsubstituted monovalent hydrocarbon group having 1 to 10 carbon atoms; i represents an integer from 0 to 3; and n represents an integer from 0 to 10. Examples of a substituent in the hydrocarbon group include a halogen atom, an amino group and a mercapto group.

Specific examples of R in the general formula (XXXXII) include substituted or unsubstituted monovalent hydrocarbon groups having 1 to 10 carbon atoms such as alkyl groups such as a methyl group, an ethyl group, a propyl group, a butyl group, an isopropyl group and a tert-butyl group, alkenyl groups such as a vinyl group, an allyl groups and a butenyl group, halogenated alkyl groups, amino group-substituted alkyl groups and mercapto group-substituted alkyl groups. Particularly, preferably, R represents an alkyl group such as a methyl group or an ethyl group, and more preferably i represents 0.

In addition, preferably, n has an average value of from 0 to 8.

Examples of a commercially available product of the novolac phenol resin represented by the general formula (XXXXII) include H-4: trade name, manufactured by Meiwa Plastic Industries Ltd.

When the epoxy resin molding material for sealing includes the novolac phenol resin, the content percentage of the novolac phenol resin is preferably 30% by mass or more, and more preferably 50% by mass or more, in the amount of the entire curing agent in order to allow the resin to exhibit performance thereof.

Any one of the curing agents may be used alone or two or more thereof may be used in combination. When two or more of the curing agents are used in combination, the content percentage of the combination in total is preferably 50% by mass or more, more preferably 60% by mass, and 80% by mass or more in the amount of the entire curing agent.

The hydroxyl group equivalent weight of the curing agent is not particularly limited. Particularly, from the viewpoint of the balance between the various characteristics such as moldability, reflow resistance and electrical reliability, the hydroxyl equivalent weight thereof is preferably from 70 g/eq to 1000 g/eq., and more preferably from 80 g/eq to 500 g/eq.

Additionally, the softening point or melting point of the curing agent is not particularly limited, and is, particularly from the viewpoint of moldability and reflow resistance, preferably from 40° C. to 180° C., and from the viewpoint of handleability in the production of the epoxy resin molding material for sealing, more preferably from 50° C. to 130° C.

In the epoxy resin molding material for sealing, an equivalent weight ratio of the epoxy resin (A) to the curing agent (B), namely a ratio of the numbers of hydroxyl groups in the curing agent with respect to epoxy groups (numbers of hydroxyl groups in the curing agent/numbers of epoxy groups in the epoxy resin) is not particularly limited. In order to reduce nonreactive ones in each group, the ratio is set preferably in a range of from 0.5 to 2.0, and more preferably in a range of from 0.6 to 1.3. Furthermore, in order to obtain an epoxy resin molding material for sealing excellent in moldability and solder reflow resistance, the ratio is set still more preferably in a range of from 0.8 to 1.2.

(C) Curing Accelerator

The epoxy resin molding material for sealing includes at least one curing accelerator. The curing accelerator is not particularly limited as long as the compound is commonly used in epoxy resin molding materials for sealing. Examples of the curing accelerator include cycloamidine compounds such as 1,8-diazabicyclo [5.4.0] undecene-7, 1,5-diazabicyclo [4.3.0] nonen-5 and 5,6-dibutylamino-1,8-diazabicyclo [5.4.0] undecene-7; compounds having intramolecular polarization obtained by adding, to these cycloamidine compounds, π bond-containing compounds such as maleic anhydrides, quinone compounds such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4 benzoquinone, 2,3-dimethoxy-1,4-benzoquinone and phenyl-1,4-benzoquinone, diazophenyl methane and phenol resins; tertiary amine compounds such as benzyldimethylamine, triethanolamine, dimethylaminoethanol and tris(dimethylaminomethyl)phenol; derivatives of these tertiary amine compounds; imidazole compounds such as 2-methylimidazole, 2-phenylimidazole, 2-phenyl-4-methylimidazole and 2-heptadecylimidazole; derivatives of these imidazole compounds; organic phosphine compounds such as tributylphosphine, methyldiphenylphosphine, triphenylphosphine, tris(4-methylphenyl)phosphine, diphenylphosphine and phenylphosphine; phosphorous compounds having intramolecular polarization obtained by adding, to these organic phosphine compounds, π bond-containing compounds such as a maleic anhydride, the above quinone compounds, a diazophenylmethane and phenol resins; tetrasubstituted phosphonium-tetra-substituted borates such as tetraphenylphosphonium tetraphenylborate, tetraphenylphosphonium ethyltriphenylborate, and tetrabutylphosphonium tetrabutylborate; tetraphenyl boron salts such as 2-ethyl-4-methylimidazole tetraphenylborate and N-methylmorpholine tetraphenylborate; and derivatives of the tetrasubstituted phosphonium-tetra-substituted borates and the tetraphenyl boron salts. Any one of these may be used alone or two or more thereof may be used in combination.

Particularly, from the viewpoint of curability and fluidity, the curing accelerator is preferably an adduct of a tertiary phosphine and a quinone compound, and more preferably an adduct of triphenylphosphine and benzoquinone or an adduct of tributylphosphine and benzoquinone. From the viewpoint of preservation stability, the curing accelerator is preferably an adduct of a cycloamidine compound and a phenol resin, and more preferably a novolac phenol resin salt of diazabicycloundecene (hereinafter also referred to as "specific curing accelerator").

The content percentages of these specific curing accelerators are preferably 60% by mass or more, and more preferably 80% by mass in total in the amount of the entire curing accelerator.

The tertiary phosphine used in the adduct of a tertiary phosphine and a quinone compound is not particularly limited. Examples of the tertiary phosphine include tributyl phosphine, and tertiary phosphines having aryl groups such as dibutylphenyl phosphine, butyldiphenyl phosphine, ethyldiphenyl phosphine, triphenyl phosphine, tris(4-methylphenyl) phosphine, tris(4-ethylphenyl) phosphine, tris(4-propylphenyl) phosphine, tris(4-butylphenyl) phosphine, tris(isopropylphenyl) phosphine, tris(tert-butylphenyl) phosphine, tris(2,4-dimethylphenyl) phosphine, tris(2,6-dimethylphenyl) phosphine, tris(2,4,6-trimethylphenyl) phosphine, tris(2,6-dimethyl-4-ethoxyphenyl) phosphine, tris(4-methoxyphenyl) phosphine, and tris(4-ethoxyphenyl) phosphine. In terms of moldability, preferred are triphenylphosphine and tributylphosphine.

In addition, the quinone compound used in the adduct of a tertiary phosphine and a quinone compound is not particularly limited. Examples of the quinone compound include o-benzoquinone, p-benzoquinone, diphenoquinone, 1,4-naphthoquinone and anthraquinone. From the viewpoint of moisture resistance or preservation stability, p-benzoquinone is preferable.

The content percentage of the curing accelerator is not particularly limited as long as the amount of the curing accelerator is an amount capable of achieving curing acceleration effect. The content percentage thereof is preferably from 0.1 parts by mass to 10 parts by mass, and more preferably from 0.3 parts by mass to 5 parts by mass, with respect to 100 parts by mass as the total amount of the epoxy resin (A) and the curing agent (B). When the content percentage thereof is 0.1 parts by mass or more, curing can be achieved in a short time. In addition, when the content percentage thereof is 10 parts by mass or less, excessively fast rate of curing is suppressed, whereby a more favorable molded article tends to be obtained.

(D) Inorganic Filler

The epoxy resin molding material for sealing includes at least one inorganic filler. By including the inorganic filler, hygroscopicity suppression, reduction in linear expansion coefficient, improvement in thermal conductivity, and strength improvement are more effectively achieved. The inorganic filler is not particularly limited as long as the filler is commonly used in epoxy resin molding materials for sealing. Examples of the inorganic filler include powders of fused silica, crystalline silica, alumina, zircon, calcium silicate, calcium carbonate, potassium titanate, silicon carbide, silicon nitride, aluminum nitride, boron nitride, beryllia, zirconia, zircon, forsterite, steatite, spinel, mullite and titania, beads obtained by spheroidization of these powders, and glass fibers. Any one of these may be used alone or two or more thereof may be used in combination. Among them, from the viewpoint of reducing linear expansion coefficient, fused silica is preferable. In addition, from the viewpoint of high thermal conductivity, alumina is preferable. Meanwhile, the inorganic filler is preferably spherical in shape, in terms of fluidity and mold abrasiveness during molding.

The inorganic filler is preferably spherical fused silica, particularly from the viewpoint of a balance between cost and performance.

The average particle size of the inorganic filler is not particularly limited. Particularly from the viewpoint of moldability, the average particle size is preferably from 5 μm to 50 μm, and more preferably from 10 μm to 30 μm. Additionally, the average particle size of the inorganic filler is measured as a volume average particle size, using a laser diffraction/scattering grain size distribution measuring apparatus.

In addition, the relative surface area of the inorganic filler is not particularly limited. Particularly from the viewpoint of moldability and strength, the relative surface area thereof is preferably from 0.5 $m^2/g$ to 12 $m^2/g$, and more preferably from 1 $m^2/g$ to 5 $m^2/g$. The relative surface area of the inorganic filler is measured based on nitrogen absorption ability at 77K in accordance with JIS Z 8830.

The content percentage of the inorganic filler is not particularly limited as long as the percentage is in a range capable of achieving the present invention. Particularly, from the viewpoint of flame retardancy improvement, moldability improvement, hygroscopicity reduction, reduction in linear expansion coefficient and strength improvement, the content percentage thereof is preferably from 70% by mass to 95% by mass in the epoxy resin molding material for sealing, and from the view t J 002211+: 0 5 5– . . . point of hygroscopicity reduction and reduction in linear expansion coefficient, more preferably from 85% by mass to 95% by mass therein. When the content percentage of the inorganic filler is 70% by mass or more, flame retardancy and reflow resistance tend to be improved. In addition, when the content percentage thereof is 95% by mass or less, excellent fluidity tends to be obtained.

(F) Other Additives

The epoxy resin molding material for sealing can include, from the viewpoint of improvement adhesiveness and the like between the resin ingredient and the inorganic ingredient in the molding material, silane compounds other than (E1) the arylamino group-containing alkoxysilane compound and (E2) the epoxy group-containing alkoxysilane compound as needed. Examples of the other silane compounds include various silane based compounds such as mercaptosilane, aminosilane, alkylsilane, ureidosilane, and vinylsilane. The other silane compounds exclude silane based compounds that overlap (E1) the arylamino group-containing alkoxysilane compound and (E2) the epoxy group-containing alkoxysilane compound.

Examples of the other silane compounds include unsaturated bond-containing silane compounds such as vinyltrichlorosilane, vinyltrimethoxysilane, vinyltriethoxysilane, vinyltris(β-methoxyethoxy) silane, γ-methacryloxypropyl trimethoxysilane, γ-methacryloxypropyl triethoxysilane, γ-methacryloxypropylmethyl dimethoxysilane, γ-methacryloxypropylmethyl diethoxysilane, γ-methacryloxypropyl dimethyl methoxysilane, γ-methacryloxypropyl dimethyl ethoxysilane, γ-acryloxypropyl trimethoxysilane, γ-acryloxypropyl triethoxysilane, and vinyl triacetoxysilane; sulfur atom-containing silane compounds such as γ-mercaptopropyl trimethoxysilane, γ-mercaptopropyl triethoxysilane, and bis(triethoxysilylpropyl) tetrasulfide; isocyanate group-containing silane compounds such as isocyanatepropyl trimethoxysilane and isocyanatepropyl triethoxysilane; silane based compounds such as methyl trimethoxysilane, methyl triethoxysilane, dimethyl dimethoxysilane, dimethyl diethoxysilane, phenyl trimethoxysilane, phenyl triethoxysilane, diphenyl dimethoxysilane, diphenyl diethoxysilane, diphenyl silanediol, triphenyl methoxysilane, triphenyl ethoxysilane, triphenyl silanol, cyclopentyl trimethoxysilane, cyclopentyl triethoxysilane, dicyclopentyl dimethoxysilane, dicyclopentyl diethoxysilane, cyclohexyl trimethoxysilane, cyclohexyl triethoxysilane, cyclohexylmethyl dimethoxysilane, N-β-(N-vinylbenzylaminoethyl)-γ-aminopropyl trimethoxysilane, γ-chloropropyl trimethoxysilane, hexamethyl disilane, 2-triethoxysilyl-N-(1,3-dimethylbutylidene) propylamine, 3-triethoxysilyl-N-(1,3-dimethylbutylidene) propylamine, N-(3-triethoxysilylpropyl) phenylimine, 3-(3-(triethoxysilyl) propylamino)-N, N-dimethyl propionamide, N-triethoxysilylpropyl-β-alaninemethylester, 3-(triethoxysilylpropyl)dihydro-3,5-furandione and bis(trimethoxysilyl) benzene; and imidazole based silane compounds, which are reaction products of imidazole compounds such as 1H-imidazole, 2-alkylimidazole, 2,4-dialkylimidazole and 4-vinylimidazole, and γ-glycidoxypropyl alkoxysilanes such as γ-glycidoxypropyl trimethoxysilane and γ-glycidoxypropyl triethoxysilane. Any one of these compounds may be used alone or two or more thereof may be used in combination.

When the epoxy resin molding material for sealing includes other silane compounds, the total content percentage thereof is, from the viewpoint of moldability and adhesiveness, preferably from 0.06% by mass to 2% by mass, more preferably from 0.1% by mass to 0.75% by mass, and still more preferably from 0.2% by mass to 0.7% by mass in the epoxy resin molding material for sealing. When the total content percentage thereof is 0.06% by mass or more, adhesiveness tends to be further improved. In addition, when the total content percentage thereof is 2% by mass or less, the occurrence of molding failure such as voids tends to be able to be suppressed.

The epoxy resin molding material for sealing may include a conventionally known coupling agent other than the silane compounds, from the viewpoint of improving the adhesiveness between the resin ingredient and the inorganic ingredient in the molding material. Examples of the coupling agent include titanate based coupling agents such as isopropyl triisostearoyl titanate, isopropyl tris(dioctylpyrophosphate) titanate, isopropyl tri(N-aminoethyl-aminoethyl) titanate, tetraoctyl bis(ditridecylphosphite) titanate, tetra(2, 2-diallyloxymethyl-1-butyl) bis(ditridecyl) phosphite titanate, bis(dioctylpyrophosphate) oxyacetate titanate, bis(dioctylpyrophosphate) ethylene titanate, isopropyl trioctanoyl titanate, isopropyl dimethacryl isostearoyl titanate, isopropyl isostearoyl diacryl titanate, isopropyl tri(dioctylphosphate) titanate, isopropyl tricumylphenyl titanate, and tetraisopropyl bis(dioctylphosphite) titanate, aluminium chelate agents, and aluminium/zirconium based compounds. Any one of these compounds may be used alone or two or more thereof may be used in combination.

In addition, when the epoxy resin molding material for sealing includes coupling agents other than the silane compounds, the total content percentage thereof is, from the viewpoint of moldability and adhesiveness, preferably from 0.06% by mass to 2% by mass, more preferably from 0.1% by mass to 0.75% by mass, and still more preferably from 0.2% by mass to 0.7% by mass in the epoxy resin molding material for sealing. When the total content percentage thereof is 0.06% by mass or more, adhesiveness tends to be further improved. In addition, when the total content percentage thereof is 2% by mass or less, the occurrence of molding failures such as voids tends to be able to be suppressed.

Additionally, the epoxy resin molding material for sealing can include, as needed, an anion exchanger, from the viewpoint of improving moisture resistance and high temperature exposure characteristics of a sealed device. The anion exchanger is not particularly limited and can be a conventionally known one. Examples of the conventionally known anion exchanger include hydrotalcites and hydroxides including an element selected from magnesium, aluminium, titanium, zirconium and bismuth. Any one of these may be used alone or two or more thereof may be used in combination. Among them, preferred is a hydrotalcite represented by the following composition formula (XXXXIII).

$$Mg_{1-x}Al_x(OH)_2(CO_3)_{x/2}.mH_2O \qquad \text{(XXXXIII)}$$

In the formula (XXXXIII), X represents a value satisfying $0<X\leq0.5$ and m represents a positive value.

When the epoxy resin molding material for sealing includes an anion exchanger, the content percentage of the anion exchanger is not particularly limited as long as the amount of the anion exchanger is sufficient to capture anion ions such as halogen ions. Particularly, the content percentage thereof is preferably from 0.1 parts by mass to 30 parts by mass, and more preferably from 1 parts by mass to 5 parts by mass, with respect to 100 parts by mass of the epoxy resin (A).

The epoxy resin molding material for sealing of the present invention can include an adhesion accelerator as needed, from the viewpoint of further improving adhesiveness. Examples of the adhesion accelerator include derivatives such as imidazole, triazole, tetrazole, and triazine, anthranilic acid, gallic acid, malonic acid, malic acid, maleic acid, aminophenol, quinoline and the like, and derivatives thereof, aliphatic acid amide compounds, dithiocarbamates, and thiadiazole derivatives. Any one of these may be used alone or two or more thereof may be used in combination.

The epoxy resin molding material for sealing may include a mold release agent as needed. As the mold release agent, for example, oxidized or nonoxidized polyolefin may be included in an amount of preferably from 0.01 parts by mass to 10 parts by mass, and more preferably from 0.1 parts by mass to 5 parts by mass, with respect to 100 parts by mass of the epoxy resin (A). When the polyolefin content is 0.01 parts by mass or more, a favorable mold release performance tends to be obtainable. In addition, when the polyolefin content is 10 parts by mass or less, adhesiveness tends to be improved.

Examples of the oxidized or nonoxidized polyolefin include low molecular weight polyethylenes having a number average molecular weight of from about 500 to 10000, such as H4, PE, and PED series: trade names, manufactured by Hoechst Ltd.

In addition, examples of mold release agents other than the oxidized or nonoxidized polyolefins include carnauba wax, montanoic acid esters, montanoic acid and stearic acid. Any one of these may be used alone or two or more thereof may be used in combination. When using another mold release agent in combination with an oxidized or nonoxidized polyolefin, the content thereof is preferably from 0.1 parts by mass to 10 parts by mass, and more preferably from 0.5 parts by mass to 3 parts by mass as a total amount of the mold release agents, with respect to 100 parts by mass of the epoxy resin (A).

The epoxy resin molding material for sealing can include a conventionally known flame retardant as needed, from the viewpoint of improving the flame retardancy of the molding material. Examples of the flame retardant include brominated epoxy resin, antimony trioxide, phosphorous compounds such as red phosphorus, red phosphorus coated by inorganic material such as zinc oxide, aluminium hydroxide, magnesium hydroxide and/or a thermosetting resin such as a phenol resin, and phosphate ester, nitrogen-containing compounds such as melamine, melamine derivatives, melamine-modified phenol resins, triazine ring-containing compounds, cyanuric acid derivatives, and isocyanuric acid derivatives, phosphorus- and nitrogen-containing compounds such as cyclophosphazene, metal element-containing compounds such as aluminium hydroxide, magnesium hydroxide, zinc oxide, zinc stannate, zinc borate, iron oxide, molybdenum oxide, zinc molybdate, and dicyclopentadienyl iron, and a composite metal hydroxide represented by the following composition formula (XXXXIV).

(XXXXIV)

In the formula (XXXXIV), $M^1$ and $M^2$ represent metal elements different from each other, and a, b, c, d, p, q and m represent positive values.

$M^1$ and $M^2$ in the composition formula (XXXXIV) are not particularly limited as long as the metal elements represented thereby are different from each other. From the viewpoint of flame retardancy, preferably, $M^1$ is selected from metal elements of the third period, alkali earth metal elements of Group IIA, and metal elements belonging to Group IVB, Group IIB, Group VIII, Group IB, Group IIIA, and Group IVA, and $M^2$ is selected from transition metal elements of Groups MB to IIB. More preferably, $M^1$ is selected from magnesium, calcium, aluminium, tin, titanium, iron, cobalt, nickel, copper and zinc, and $M^2$ is selected from iron, cobalt, nickel, copper and zinc. In addition, from the viewpoint of fluidity, preferably, $M^1$ represents magnesium and $M^2$ represents zinc or nickel. The mole ratio of p to q is not particularly limited. The ratio of p/q is preferably from 1/99 to 1/1. Additionally, a, b, c and d are appropriately selected in accordance with $M^1$ and $M^2$.

Classification of the metal elements was made based on a long-period periodic table including typical elements as Subgroup A and transition elements as Subgroup B (source: Kagaku Daijiten (Chemical Encyclopedia), 30th, reduced-size edition, Kyoritsu Shuppan, Feb. 15, 1987).

In addition, examples of the flame retardant include metal element-containing compounds such as zinc oxide, zinc stannate, zinc borate, iron oxide, molybdenum oxide, zinc molybdate and dicyclopentadienyl iron. Any one of these flame retardants may be used alone or two or more thereof may be used in combination.

When the epoxy resin molding material for sealing includes a flame retardant, the content of the flame retardant is not particularly limited. Particularly, the content thereof is preferably from 1 parts by mass to 30 parts by mass, and more preferably from 2 parts by mass to 15 parts by mass, with respect to 100 parts by mass of the epoxy resin (A).

The epoxy resin molding material for sealing can include a colorant such as carbon black, an organic dye, an organic pigment, titanium oxide, red lead and colcothar. Furthermore, the material for sealing can include, as other additives, a thermoplastic resin such as a polyphenylene ether and an indene oligomer that is a copolymer resin of an indene such as indene or alkyl indene, a styrene such as styrene or alkyl styrene and a phenol, and a stress relaxation agent such as silicone oil or silicone rubber powder, as needed.

<Method for Preparing Epoxy Resin Molding Material for Sealing>

The epoxy resin molding material for sealing can be prepared using any method as long as various ingredients can be evenly dispersed and mixed together. As an example of a common method, predetermined amounts of ingredients to be added are mixed together sufficiently by a mixer or the like, then fused and kneaded by an extruder or the like, and cooled down and pulverized. For example, the epoxy resin molding material for sealing can be obtained by evenly stirring and mixing the predetermined amounts of the ingredients described above and then performing kneading with a kneader, a roll, an extruder, or the like preheated to from 70° C. to 140° C., cooling down, pulverizing and the like. The obtained material can be made easily usable by making into tablet with a size and a mass so as to meet molding requirements.

<Electronic Component Device>

An electronic component device of the present invention includes an element sealed with the epoxy resin molding material for sealing, and is formed by including, as needed, other constituent components.

Specific examples of the electronic component device including an element sealed with the epoxy resin molding material for sealing include electronic component devices in which elements such as active elements such as a semiconductor chip, transistors, diodes and thyristors, and passive elements such as capacitors, resistors and coils are mounted on a support member such as a lead frame, a wired tape carrier, a wiring board, glass or silicon wafer, and necessary parts are sealed with the epoxy resin molding material for sealing. Examples of such electronic component devices include common resin-sealed ICs such as DIP (Dual Inline Package), PLCC (Plastic Leaded Chip Carrier), QFP (Quad Flat Package), SOP (Small Outline Package), SOJ (Small Outline J-lead package), TSOP (Thin Small Outline Package), and TQFP (Thin Quad Flat Package), which are formed by fixing a semiconductor element on a lead frame, connecting element terminals such as bonding pads to lead portions by wire bonding or bumps, and then sealing with the epoxy resin molding material for sealing by transfer molding or the like; TCP (Tape Carrier Package) formed by connecting a semiconductor chip to a tape carrier by bumps and sealing the chip with the epoxy resin molding material for sealing; COB (Chip On Board) modules, hybrid ICs, and multichip modules, in which active elements such as semiconductor chips, transistors, diodes and thyristors and/or passive elements such as capacitors, resistors and coils connected to wires formed on a wiring board or glass by wire bonding, flip chip bonding, soldering or the like, are sealed with the epoxy resin molding material for sealing; BGA (Ball Grid Array) and CSP (Chip Size Package) in which elements are mounted on a front surface of an organic substrate having terminals for connecting to a wiring board on a back surface of the substrate to connect the elements to wires formed on the organic substrate by bumps or wire bonding and then the elements are sealed with the epoxy resin molding material for sealing. In addition, the epoxy resin molding material for sealing can also effectively used for printed circuit boards.

As a method for sealing elements with the epoxy resin molding material for sealing, a low-pressure transfer molding method is the most common, but an injection molding method, a compression molding method or the like may be used. In addition, conditions for sealing elements can be appropriately selected in accordance with the structure and the like of the epoxy resin molding material for sealing.

The disclosures of Japanese Patent Application Nos. 2011-108227 and 2011-256806 are incorporated herein by reference in their entirety.

All documents, patent applications, and technical standards described in the present specification are incorporated herein by reference to the same extent as if each individual document, patent application, or technical standard were specifically and individually indicated to be incorporated by reference.

EXAMPLES

Next, the present invention will be described in more detail with reference to Examples, but the scope of the present invention is not limited to these Examples. In addition, the term "parts" and "%" are based on mass, unless otherwise specified.

Production of Epoxy Resin Molding Material for Sealing

Examples 1 to 24 and Comparative Examples 1 to 14

The following ingredients were mixed together in respective amounts of parts by mass indicated in the following Tables 1 to 6 and then the mixture was roll-kneaded under conditions of a roll-kneading temperature of 80° C. and a roll-kneading time of 10 minutes to produce an epoxy resin molding material for sealing of each of Examples 1 to 24 and Comparative Examples 1 to 14. The blanks in the Tables indicate unmixed.

As the epoxy resin (A), the followings were used:

Epoxy resin 1: an ortho-cresol novolac epoxy resin having an epoxy equivalent weight of 200 and a softening point of 67° C. (trade name: ESCN-190, manufactured by Sumitomo Chemical Co., Ltd).

Epoxy resin 2: a biphenyl epoxy resin having an epoxy equivalent weight of 196 and a melting point of 106° C. (trade name: YX-4000H, manufactured by Japan Epoxy Resin Co., Ltd).

Epoxy resin 3: a thiodiphenol epoxy resin having an epoxy equivalent weight of 242 and a melting point of 118° C. (trade name: YSLV-120TE, manufactured by Nippon Steel Chemical Co., Ltd).

Epoxy resin 4: a biphenylene structure-containing phenol aralkyl epoxy resin having an epoxy equivalent weight of 241 and a softening point of 96° C. (trade name: CER-3000L, manufactured by Nippon Kayaku Co. Ltd).

Epoxy resin 5: an epoxide of phenol aralkyl resin having an epoxy equivalent weight of 238 and a softening point of 52° C. (trade name: NC-2000L, manufactured by Nippon Kayaku Co. Ltd).

Epoxy resin 6: a bisphenol A brominated epoxy resin having an epoxy equivalent weight of 375, a softening point of 80° C., and a bromine content of 48% by mass.

Epoxy resin 7: an epoxy resin having an epoxy equivalent weight of 251 and a softening point of 60 degrees C., which is represented by general formula (XXXXV) (trade name: HP-5000, manufactured by DIC Co. Ltd).

As the curing agent (B), the followings were used:

Curing agent 1: a phenol aralkyl resin having a hydroxyl group equivalent weight of 199 and a softening point of 89° C. (trade name: MEH-7851, manufactured by Meiwa Plastic Industries Ltd).

Curing agent 2: a phenol aralkyl resin having a hydroxyl group equivalent weight of 176 and a softening point of 70° C. (trade name: MILEX XLC manufactured by Mitsui Chemicals Inc).

Curing agent 3: a novolac phenol resin having a hydroxyl group equivalent weight of 106 and a softening point of 64° C. (trade name: H-4, manufactured by Meiwa Plastic Industries Ltd).

As the curing accelerator (C), the followings were used.

Curing accelerator 1: a betaine adduct of triphenylphosphine and p-benzoquinone.

Curing accelerator 2: a betaine adduct of tributylphosphine and p-benzoquinone.

As the inorganic filler (D), a spherical fused silica having an average particle size of 17.5 μm and a relative surface area of 3.8 m$^2$/g was used.

As (E1) the arylamino group-containing alkoxysilane compound, γ-anilinopropyl trimethoxysilane ((E1) silane compound 1) was used.

As (E2) the epoxy group-containing alkoxysilane compound, the followings were used:

(E2) silane compound 1: γ-glycidoxypropyl trimethoxysilane (E2) silane compound 2: β-(3,4-epoxycyclohexyl)ethyl trimethoxysilane As a silane compound other than the (E1) and the (E2), γ-aminopropyl trimethoxysilane (the other silane compound 1) was used.

As other additive ingredients, carnauba wax (Clariant Japan Co., Ltd.), antimony trioxide, and carbon black (Mitsubishi Chemical Co. Ltd) were used.

[Evaluation of Epoxy Resin Molding Material for Sealing]

Property of epoxy resin molding materials for sealing produced in Examples 1 to 24 and Comparative Examples 1 to 14 were evaluated by the following respective property tests (1) to (6). The evaluation results were given in Tables 1 to 6 below. Molding of each of the epoxy resin molding materials for sealing was performed by a transfer molding machine at a mold temperature of 180° C. and a molding pressure of 6.9 MPa for a curing time of 90 seconds. In addition, as needed, a post-curing was performed under conditions of 180° C. and 5 hours.

(1) Spiral Flow

Using a mold for measuring spiral flow in accordance with EMMI-1-66, molding of each of the epoxy molding materials for sealing was performed under the above conditions to obtain a flow distance (cm).

(2) Hot Hardness

The each epoxy resin molding material for sealing was molded into a disk with a diameter of 50 mm and a thickness of 3 mm under the above conditions, and immediately after the molding, hot hardness was measured using a Shore Type D hardness tester (HD-1120 (TYPE D) manufactured by Ueshima Seisakusho Co., Ltd).

(3) Bending Elastic Modulus at 260° C.

The epoxy resin molding materials for sealing were molded into a shape of 10 mm×70 mm×3 mm under the above conditions and then post-curing was performed to produce test pieces. Regarding the obtained test pieces, a three-point supported bending test in accordance with JIS-K-6911 was performed in a thermostat chamber maintained at 260° C. using TENSILON manufactured by A&D Co., Ltd., to obtain a bending elastic modulus (MPa) at 260° C.

(4) Water Absorption Percentage

The disks molded in the (2) were post-cured under the above conditions. The obtained disks were allowed to stand for 168 hours under conditions of 85° C. and 60% RH to measure changes in mass before and after allowing to stand, and then evaluation was performed using an equation: water absorption percentage (% by mass)=(mass of disk after allowing to stand−mass of disk before allowing to stand)/mass of disk before allowing to stand×100.

(5) Reflow Resistance

A 80 pin flat package (QFP) (lead frame material: copper alloy; die pad upper surface and lead tip: silver-plated) having outline dimensions of 20 mm×14 mm×2 mm, which mounts a silicon chip having dimensions of 8 mm×10 mm×0.4 mm, was produced by molding and post-curing each of the epoxy resin molding materials for sealing under the above conditions. The obtained each package was humidified for 168 hours under conditions of 85° C. and 85% RH, and then subjected to reflow treatment under conditions of predetermined temperatures (235° C., 245° C. and 255° C.) and 10 seconds. Then, visual observation of the presence or absence of cracking in an outer part of the package and observation of the presence or absence of the occurrence of peeling-off in an inner part of the package using an ultrasonic flaw detector (HYE-FOCUS manufactured by Hitachi Construction Machinery Co. Ltd.), respectively, were performed to evaluate based on a total number of packages having either cracking or peeling-off with respect to the number of test packages (10).

(6) Flame Retardancy

Using a mold for molding a test piece having a thickness of 1/16 inches (about 1.6 mm), the epoxy resin molding materials for sealing were molded and post-cured under the above conditions to produce test pieces. Flame retardancy of each of the obtained test pieces was evaluated in accordance with an UL-94 testing method.

TABLE 1

| Items | | | Examples |||||||| 
|---|---|---|---|---|---|---|---|---|---|---|
| | | | 1 | 2 | 3 | 4 | 5 | 6 | 7 | 8 |
| Formulation | Epoxy Resin | 1 | 85 | | | | | | | |
| | | 2 | | 100 | | | | | | |
| | | 3 | | | 100 | | | | | |
| | | 4 | | | | 100 | 100 | 100 | 100 | 100 |
| | | 6 | 15 | | | | | | | |
| | Curing Agent | 1 | | | | | 82.2 | | | |
| | | 2 | | 89.8 | 72.7 | | 72.7 | 72.7 | 72.7 | 72.7 |
| | | 3 | 49.3 | | | | | | | |
| | (E1) Silane Compound | 1 | 2.0 | 2.0 | 2.0 | 2.0 | 0.5 | 1.0 | 2.0 | 3.5 |
| | (E2) Silane Compound | 1 | 5.0 | 5.0 | 5.0 | 5.0 | 6.5 | 6.0 | 5.0 | 3.5 |
| | Curing Accelerator | 1 | 2.8 | | 3.8 | | 3.0 | 3.0 | 3.0 | 3.0 |
| | | 2 | | 4.5 | | 3.0 | | | | |
| | Antimony Trioxide | | 6.0 | | | | | | | |
| | Carnauba Wax | | 2.0 | 2.0 | 2.0 | 2.0 | 2.0 | 2.0 | 2.0 | 2.0 |
| | Carbon Black | | 1.5 | 1.5 | 1.5 | 1.5 | 1.5 | 1.5 | 1.5 | 1.5 |
| | Fused Silica | | 1180 | 1536 | 1403 | 1435 | 1366 | 1366 | 1366 | 1366 |
| (E1) Content (% by mass) with respect to E1 + E2 | | | 28.6 | 28.6 | 28.6 | 28.6 | 7.1 | 14.3 | 28.6 | 50.0 |
| Total Amount of E1 and E2 with respect to Epoxy Resin (% by mass) | | | 7.0 | 7.0 | 7.0 | 7.0 | 7.0 | 7.0 | 7.0 | 7.0 |
| Evaluation Items | Spiral Flow (cm) | | 75 | 97 | 94 | 94 | 85 | 86 | 89 | 89 |
| | Hot Hardness | | 82 | 81 | 81 | 81 | 80 | 81 | 82 | 82 |
| | Bending Elastic Modulus at 260° C. (MPa) | | 800 | 680 | 680 | 580 | 690 | 680 | 660 | 670 |
| | Water Absorption Percentage (%) | | 0.159 | 0.124 | 0.124 | 0.123 | 0.125 | 0.124 | 0.124 | 0.124 |

TABLE 1-continued

|  | Items |  | \multicolumn{8}{c}{Examples} |
|---|---|---|---|---|---|---|---|---|---|---|
|  |  |  | 1 | 2 | 3 | 4 | 5 | 6 | 7 | 8 |
|  | Reflow Resistance | 235° C. | 0/10 | 0/10 | 0/10 | 0/10 | 0/10 | 0/10 | 0/10 | 0/10 |
|  |  | 245° C. | 0/10 | 0/10 | 0/10 | 0/10 | 0/10 | 0/10 | 0/10 | 0/10 |
|  |  | 255° C. | 4/10 | 1/10 | 0/10 | 0/10 | 3/10 | 2/10 | 0/10 | 0/10 |
|  | Flame Retardancy: Total Lingering Flame Time (s) |  | 15 | 44 | 44 | 20 | 39 | 39 | 37 | 36 |
|  | Judgment |  | V-0 | V-0 | V-0 | V-0 | V-0 | V-0 | V-0 | V-0 |

TABLE 2

|  | Items |  | \multicolumn{8}{c}{Examples} |
|---|---|---|---|---|---|---|---|---|---|---|
|  |  |  | 9 | 10 | 11 | 12 | 13 | 14 | 15 | 16 |
| Formulation | Epoxy Resin | 4 | 100 | 100 | 100 | 100 | 100 | 100 | 100 | 100 |
|  | Curing Agent | 2 | 72.7 | 72.7 | 72.7 | 72.7 | 72.7 | 72.7 | 72.7 | 72.7 |
|  | (E1) Silane Compound | 1 | 4.0 | 5.0 | 6.0 | 0.5 | 1.0 | 3.0 | 4.0 | 5.0 |
|  | (E2) Silane Compound | 1 | 3.0 | 2.0 | 1.0 | 1.3 | 2.5 | 7.5 | 10.0 | 12.5 |
|  | Curing Accelerator | 1 | 3.0 | 3.0 | 3.0 | 3.0 | 3.0 | 3.0 | 3.0 | 3.0 |
|  | Carnauba Wax |  | 2.0 | 2.0 | 2.0 | 2.0 | 2.0 | 2.0 | 2.0 | 2.0 |
|  | Carbon Black |  | 1.5 | 1.5 | 1.5 | 1.5 | 1.5 | 1.5 | 1.5 | 1.5 |
|  | Fused Silica |  | 1366 | 1366 | 1366 | 1328 | 1340 | 1391 | 1417 | 1443 |
| (E1) Content (% by mass) with respect to E1 + E2 |  |  | 57.1 | 71.4 | 85.7 | 27.8 | 28.6 | 28.6 | 28.6 | 28.6 |
| Total Amount of E1 and E2 with respect to Epoxy Resin (% by mass) |  |  | 7.0 | 7.0 | 7.0 | 1.8 | 3.5 | 10.5 | 14.0 | 17.5 |
| Evaluation Items | Spiral Flow (cm) |  | 89 | 89 | 89 | 86 | 87 | 91 | 94 | 99 |
|  | Hot Hardness |  | 82 | 82 | 82 | 81 | 81 | 81 | 81 | 80 |
|  | Bending Elastic Modulus at 260° C. (MPa) |  | 680 | 700 | 720 | 670 | 670 | 670 | 670 | 670 |
|  | Water Absorption Percentage (%) |  | 0.123 | 0.123 | 0.122 | 0.124 | 0.124 | 0.124 | 0.124 | 0.124 |
|  | Reflow Resistance | 235° C. | 0/10 | 0/10 | 0/10 | 0/10 | 0/10 | 0/10 | 0/10 | 0/10 |
|  |  | 245° C. | 0/10 | 0/10 | 0/10 | 0/10 | 0/10 | 0/10 | 0/10 | 0/10 |
|  |  | 255° C. | 0/10 | 2/10 | 3/10 | 3/10 | 2/10 | 0/10 | 2/10 | 3/10 |
|  | Flame Retardancy: Total Lingering Flame Time (s) |  | 35 | 34 | 33 | 39 | 39 | 41 | 41 | 42 |
|  | Judgment |  | V-0 | V-0 | V-0 | V-0 | V-0 | V-0 | V-0 | V-0 |

TABLE 3

| Items |  |  | \multicolumn{6}{c}{Examples} |
|---|---|---|---|---|---|---|---|---|
|  |  |  | 17 | 18 | 19 | 20 | 21 | 22 |
| Formulation | Epoxy Resin | 4 | 100 | 100 |  |  |  |  |
|  |  | 5 |  |  | 100 | 100 | 100 | 100 |
|  | Curing Agent | 2 | 72.7 | 72.7 | 73.9 | 73.9 | 73.9 | 73.9 |
|  | (E1) Silane Compound | 1 | 2.0 | 3.5 | 2.0 | 3.5 | 2.0 | 3.5 |
|  | (E2) Silane Compound | 1 |  |  | 5.0 | 3.5 |  |  |
|  |  | 2 | 5.0 | 3.5 |  |  | 5.0 | 3.5 |
|  | Curing Accelerator | 1 | 3.0 | 3.0 | 3.0 | 3.0 | 3.0 | 3.0 |
|  | Carnauba Wax |  | 2.0 | 2.0 | 2.0 | 2.0 | 2.0 | 2.0 |
|  | Carbon Black |  | 1.5 | 1.5 | 1.5 | 1.5 | 1.5 | 1.5 |
|  | Fused Silica |  | 1366 | 1366 | 1343 | 1343 | 1343 | 1343 |
| (E1) Content (% by mass) with respect to E1 + E2 |  |  | 28.6 | 50.0 | 28.6 | 50.0 | 28.6 | 50.0 |
| Total Amount of E1 and E2 with respect to Epoxy Resin (% by mass) |  |  | 7.0 | 7.0 | 7.0 | 7.0 | 7.0 | 7.0 |
| Evaluation Items | Spiral Flow (cm) |  | 87 | 87 | 92 | 92 | 91 | 91 |
|  | Hot Hardness |  | 81 | 81 | 81 | 81 | 80 | 80 |
|  | Bending elastic Modulus at 260° C. (MPa) |  | 650 | 650 | 620 | 630 | 620 | 630 |

TABLE 3-continued

|  |  | Examples | | | | | |
| --- | --- | --- | --- | --- | --- | --- | --- |
| Items | | 17 | 18 | 19 | 20 | 21 | 22 |
| Water Absorption Percentage (%) | | 0.123 | 0.122 | 0.139 | 0.138 | 0.138 | 0.137 |
| Reflow Resistance | 235° C. | 0/10 | 0/10 | 0/10 | 0/10 | 0/10 | 0/10 |
|  | 245° C. | 0/10 | 0/10 | 0/10 | 0/10 | 0/10 | 0/10 |
|  | 255° C. | 0/10 | 0/10 | 1/10 | 1/10 | 0/10 | 0/10 |
| Flame Retardancy: Total Lingering Flame Time (s) | | 40 | 39 | 40 | 39 | 42 | 41 |
| Judgment | | V-0 | V-0 | V-0 | V-0 | V-0 | V-0 |

TABLE 4

|  |  |  | Comparative Examples | | | | | | |
| --- | --- | --- | --- | --- | --- | --- | --- | --- | --- |
|  | Items |  | 1 | 2 | 3 | 4 | 5 | 6 | 7 |
| Formulation | Epoxy Resin | 1 | 85 | | | | | | |
|  |  | 2 | | 100 | 100 | | | | |
|  |  | 3 | | | | 100 | 100 | | |
|  |  | 4 | | | | | | 100 | 100 |
|  |  | 6 | 15 | | | | | | |
|  | Curing Agent | 1 | | | | | | 82..2 | |
|  |  | 2 | | 89.8 | 89.8 | 72.7 | 72.7 | | 72.7 |
|  |  | 3 | 49.3 | | | | | | |
|  | (E1) Silane Compound | 1 | | | 7.0 | | 7.0 | | |
|  | (E2) Silane Compound | 1 | 7.0 | 7.0 | | 7.0 | | 7.0 | 7.0 |
|  |  | 2 | | | | | | | |
|  | Curing Accelerator | 1 | 2.8 | | | 3.8 | 3.8 | | 3.0 |
|  |  | 2 | | 4.5 | 4.5 | | | 3.0 | |
|  | Antimony Trioxide | | 6.0 | | | | | | |
|  | Carnauba Wax | | 2.0 | 2.0 | 2.0 | 2.0 | 2.0 | 2.0 | 2.0 |
|  | Carbon Black | | 1.5 | 1.5 | 1.5 | 1.5 | 1.5 | 1.5 | 1.5 |
|  | Fused Silica | | 1180 | 1536 | 1536 | 1403 | 1403 | 1435 | 1366 |
| (E1) Content (% by mass) with respect to E1 + E2 | | | 0.0 | 0.0 | 100.0 | 0.0 | 100.0 | 0.0 | 0.0 |
| Total Amount of E1 and E2 with respect to Epoxy Resin (% by mass) | | | 7.0 | 7.0 | 7.0 | 7.0 | 7.0 | 7.0 | 7.0 |
| Evaluation Items | Spiral Flow (cm) | | 72 | 93 | 97 | 90 | 94 | 90 | 85 |
|  | Hot Hardness | | 80 | 79 | 81 | 79 | 81 | 79 | 80 |
|  | Bending Elastic Modulus at 260° C. (MPa) | | 880 | 700 | 780 | 690 | 760 | 600 | 690 |
|  | Water Absorption Percentage (%) | | 0.161 | 0.127 | 0.122 | 0.127 | 0.122 | 0.124 | 0.127 |
|  | Reflow Resistance | 235° C. | 0/10 | 0/10 | 0/10 | 0/10 | 0/10 | 0/10 | 0/10 |
|  |  | 245° C. | 1/10 | 0/10 | 1/10 | 0/10 | 1/10 | 0/10 | 0/10 |
|  |  | 255° C. | 5/10 | 5/10 | 7/10 | 4/10 | 6/10 | 4/10 | 4/10 |
|  | Flame Retardancy: Total Lingering Flame Time (s) | | 15 | 47 | 41 | 47 | 41 | 21 | 39 |
|  | Judgment | | V-0 | V-0 | V-0 | V-0 | V-0 | V-0 | V-0 |

TABLE 5

|  |  |  | Comparative Examples | | | | | |
| --- | --- | --- | --- | --- | --- | --- | --- | --- |
|  | Items |  | 8 | 9 | 10 | 11 | 12 | 13 |
| Formulation | Epoxy Resin | 4 | 100 | 100 | | | | 100 |
|  |  | 5 | | | 100 | 100 | 100 | |
|  | Curing Agent | 2 | 72.7 | 72.7 | 73.9 | 73.9 | 73.9 | 72.7 |
|  | (E1) Silane Compound | 1 | 7.0 | | | 7.0 | | |
|  | (E2) Silane Compound | 1 | | | 7.0 | | | 5.0 |
|  |  | 2 | | 7.0 | | | 7.0 | |
|  | Silane Compound | 1 | | | | | | 2.0 |
|  | Curing Accelerator | 1 | 3.0 | 3.0 | 3.0 | 3.0 | 3.0 | 3.0 |

TABLE 5-continued

|  | Items |  | Comparative Examples | | | | | |
|---|---|---|---|---|---|---|---|---|
|  |  |  | 8 | 9 | 10 | 11 | 12 | 13 |
|  | Carnauba Wax |  | 2.0 | 2.0 | 2.0 | 2.0 | 2.0 | 2.0 |
|  | Carbon Black |  | 1.5 | 1.5 | 1.5 | 1.5 | 1.5 | 1.5 |
|  | Fused Silica |  | 1366 | 1366 | 1343 | 1343 | 1343 | 1366 |
| (E1) Content (% by mass) with respect to E1 + E2 |  |  | 100.0 | 0.0 | 0.0 | 100.0 | 0.0 | 0.0 |
| Total Amount of E1 and E2 with respect to Epoxy Resin (% by mass) |  |  | 7.0 | 7.0 | 7.0 | 7.0 | 7.0 | 5.0 |
| Evaluation Items | Spiral Flow (cm) |  | 89 | 84 | 88 | 92 | 87 | 75 |
|  | Hot Hardness |  | 82 | 79 | 79 | 81 | 78 | 82 |
|  | Bending Elastic Modulus at 260° C. (MPa) |  | 760 | 680 | 660 | 720 | 650 | 750 |
|  | Water Absorption Percentage (%) |  | 0.122 | 0.126 | 0.141 | 0.136 | 0.140 | 0.130 |
|  | Reflow Resistance | 235° C. | 0/10 | 0/10 | 0/10 | 0/10 | 0/10 | 0/10 |
|  |  | 245° C. | 1/10 | 0/10 | 0/10 | 1/10 | 0/10 | 2/10 |
|  |  | 255° C. | 6/10 | 4/10 | 4/10 | 5/10 | 4/10 | 6/10 |
|  | Flame Retardancy: Total Lingering Flame Time (s) |  | 33 | 42 | 41 | 36 | 43 | 52 |
|  | Judgment |  | V-0 | V-0 | V-0 | V-0 | V-0 | V-1 |

TABLE 6

|  | Items |  | Examples | | Comparative Examples |
|---|---|---|---|---|---|
|  |  |  | 23 | 24 | 14 |
| Formulation | Epoxy Resin | 7 | 100 | 100 | 100 |
|  | Curing Agent | 2 | 70.1 | 70.1 | 70.1 |
|  | (E1) Silane Compound | 1 | 2.0 | 3.5 |  |
|  | (E2) Silane Compound | 1 | 5.0 | 3.5 | 7.0 |
|  | Curing Accelerator | 1 | 3.0 | 3.0 | 3.0 |
|  | Carnauba Wax |  | 2.0 | 2.0 | 2.0 |
|  | Carbon Black |  | 1.5 | 1.5 | 1.5 |
|  | Fused Silica |  | 1316 | 1316 | 1316 |
| (E1) Content (% by mass) with respect to E1 + E2 |  |  | 28.6 | 50.0 | 0.0 |
| Total Amount of E1 and E2 with respect to Epoxy Resin (% by mass) |  |  | 7.0 | 7.0 | 7.0 |
| Evaluation Items | Spiral Flow (cm) |  | 92 | 92 | 88 |
|  | Hot Hardness |  | 80 | 80 | 78 |
|  | Bending Elastic Modulus at 260° C. (MPa) |  | 580 | 600 | 620 |
|  | Water Absorption Percentage (%) |  | 0.136 | 0.137 | 0.139 |
|  | Reflow Resistance | 235° C. | 0/10 | 0/10 | 0/10 |
|  |  | 245° C. | 0/10 | 0./10 | 0/10 |
|  |  | 255° C. | 0/10 | 0/10 | 4/10 |
|  | Flame Retardancy: Total Lingering Flame Time (s) |  | 39 | 38 | 40 |
|  | Judgment |  | V-0 | V-0 | V-0 |

Tables 1 to 6 indicate that Comparative Examples 1 to 13 in which the compounds of the ingredients (E1) and (E2) were not added in combination were inferior in terms of fluidity and reflow resistance. Comparative Examples 3, 5, 8 and 11 including only the compound of the ingredient (E1) are inferior in terms of reflow resistance, and Comparative Examples 1, 2, 4, 6, 7, 9, 10, 12 and 14 including only the compound of the ingredient (E2) are inferior in terms of fluidity and reflow resistance. In addition, in Comparative Example 13 including an amino group-containing silane compound having a different structure from the ingredient (E1), fluidity and reflow resistance were significantly reduced, and also were inferior in terms of flame retardancy, thus not achieving UL-94 V-0.

In contrast, regarding Examples 1 to 24 including the combination of the ingredients (E1) and (E2), as compared with Comparative Examples having the same resin composition except that the formulation of the silane compounds other than the ingredients (E1) and (E2) was partially different, excellent reflow resistance and excellent moldabilities such as fluidity and hot hardness were obtained, as well as all of the Examples achieved UL-94 V-0 and also had excellent flame retardancy.

The invention claimed is:

1. An epoxy resin molding material for sealing, comprising;

(A) an epoxy resin comprising a combination of an epoxy resin of the following general formula (X) in which each of $R^1$ to $R^8$ represents a hydrogen atom and i represents 0, and an epoxy resin of the following general formula (IV) in which each of $R^1$ to $R^8$ represents a hydrogen atom and n represents 0:

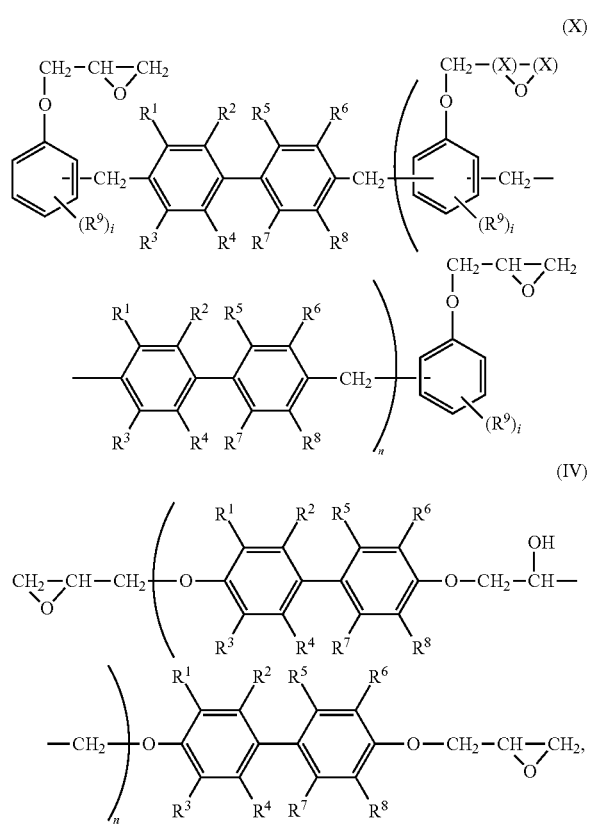

(B) a curing agent comprising a phenol aralkyl resin of the following general formula (XXXVII) in which n represents an integer from 0 to 10:

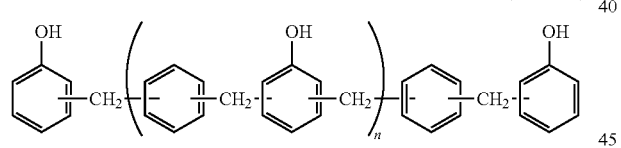

(C) a curing accelerator comprising an adduct of a tertiary phosphine and a quinone compound,
(D) an inorganic filler comprising a silica,
(E) silane compounds consisting of:
  (E1) at least one arylamino group-containing alkoxysilane compound, and
  (E2) at least one epoxy group-containing alkoxysilane compound,
wherein the epoxy resin molding material is substantially free of a silane compound different from the (E1) arylamino group-containing alkoxysilane compound and the (E2) epoxy group-containing alkoxysilane compound,
wherein a total amount of (E1) the arylamino group-containing alkoxysilane compound in the epoxy resin molding material for sealing is from 20% by mass to 60% by mass with respect to a total amount of (E1) the arylamino group-containing alkoxysilane compound and (E2) the epoxy group-containing alkoxysilane compound in the epoxy resin molding material for sealing,
wherein a total amount of (E1) the arylamino group-containing alkoxysilane compound and (E2) the epoxy group-containing alkoxysilane compound in the epoxy resin molding material for sealing is from 7.0% by mass to 12.0% by mass with respect to a total amount of epoxy resin contained in the epoxy resin molding material for sealing, and
wherein a content of (D) the inorganic filler is 87.5% by mass or more with respect to a total amount of the epoxy resin molding material.

2. The epoxy resin molding material for sealing according to claim 1, wherein (E1) the arylamino group-containing alkoxysilane compound is a compound represented by the following general formula (I):

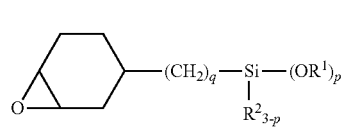

wherein in the general formula (I), $R^1$ and $R^2$ each independently represent a hydrocarbon group having 1 to 6 carbon atoms, which may have a substituent; p represents an integer from 1 to 3; and q represents 2 or 3.

3. The epoxy resin molding material for sealing according to claim 1, wherein (E2) the epoxy group-containing alkoxysilane compound is at least one compounds represented by the following general formulas (II) or (III):

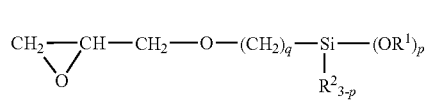

wherein in the general formula (II), $R^1$ and $R^2$ each independently represent a hydrocarbon group having 1 to 6 carbon atoms, which may have a substituent; p represents an integer from 1 to 3; and q represents 2 or 3; and

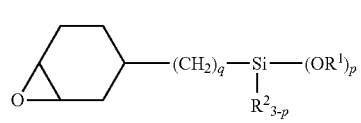

wherein in the general formula (III), $R^1$ and $R^2$ each independently represent a hydrocarbon group having 1 to 6 carbon atoms, which may have a substituent; p represents an integer from 1 to 3; and q represents 2 or 3.

4. An electronic component device comprising an element sealed with the epoxy resin molding material for sealing according to claim 1.

* * * * *